(12) United States Patent
Fujino

(10) Patent No.: US 9,123,669 B2
(45) Date of Patent: Sep. 1, 2015

(54) DISPLAY UNIT AND ELECTRONIC APPARATUS

(71) Applicant: Sony Corporation, Tokyo (JP)

(72) Inventor: Yuusuke Fujino, Kanagawa (JP)

(73) Assignee: JOLED, INC., Tokyo (JP)

(*) Notice: Subject to any disclaimer, the term of this patent is extended or adjusted under 35 U.S.C. 154(b) by 0 days.

(21) Appl. No.: 14/346,922

(22) PCT Filed: Sep. 25, 2012

(86) PCT No.: PCT/JP2012/074550
§ 371 (c)(1),
(2) Date: Mar. 24, 2014

(87) PCT Pub. No.: WO2013/051428
PCT Pub. Date: Apr. 11, 2013

(65) Prior Publication Data
US 2014/0231790 A1    Aug. 21, 2014

(30) Foreign Application Priority Data

Oct. 3, 2011    (JP) .................. 2011-219054

(51) Int. Cl.
*H01L 51/00*    (2006.01)
*H01L 27/32*    (2006.01)
*H01L 51/52*    (2006.01)

(52) U.S. Cl.
CPC .......... *H01L 27/3213* (2013.01); *H01L 27/322* (2013.01); *H01L 51/5284* (2013.01); *H01L 51/524* (2013.01)

(58) Field of Classification Search
CPC ... H01L 27/3213; H01L 27/322; H01L 51/42; H01L 51/44; H01L 51/50; H01L 51/5012; H01L 51/5036; H01L 51/5262; H01L 51/5275
USPC .......................................................... 257/40
See application file for complete search history.

(56) References Cited

U.S. PATENT DOCUMENTS 5,073,008 A  *  12/1991  Terashita et al. .............. 359/589

(Continued)

FOREIGN PATENT DOCUMENTS

| JP | 04-054207 B2 | 8/1992 |
| JP | 2000-152265 | 5/2000 |

(Continued)

*Primary Examiner* — Daniel Whalen
*Assistant Examiner* — Aneta Cieslewicz
(74) *Attorney, Agent, or Firm* — K&L Gates LLP

(57) ABSTRACT

A display unit is provided. The display unit includes a plurality of pixels having first to third sub-pixels each of which corresponds to respective colors of red, green, and blue, and a fourth sub-pixel exhibiting higher luminance than the first to third sub-pixels. In each of the pixels, the first to fourth sub-pixels have light-emitting devices. In the first to third sub-pixels, color filters are provided, and in the fourth sub-pixel, the transmittance of light emitted from the light-emitting device is configured to be reduced at a partial or whole region of the fourth sub-pixel. A difference in the transmittance among the first to third sub-pixels having the color filters and the fourth sub-pixel having no color filter is reduced to ensure an excellent luminance balance, which makes it easy to represent desired chromaticity.

19 Claims, 17 Drawing Sheets

(56) References Cited

U.S. PATENT DOCUMENTS

| | | | |
|---|---|---|---|
| 2004/0169797 A1* | 9/2004 | Fujita et al. | 349/110 |
| 2007/0090751 A1* | 4/2007 | Cok et al. | 313/501 |
| 2009/0115952 A1 | 5/2009 | Nakamura et al. | |
| 2009/0284139 A1* | 11/2009 | Ushikubo et al. | 313/504 |
| 2011/0043096 A1* | 2/2011 | Asaki | 313/483 |
| 2013/0020933 A1* | 1/2013 | Levermore et al. | 313/504 |

FOREIGN PATENT DOCUMENTS

| | | |
|---|---|---|
| JP | 2005-012905 | 1/2005 |
| JP | 2006-309118 | 11/2006 |
| JP | 2007-026867 | 2/2007 |
| JP | 2008-518400 | 5/2008 |
| JP | 2010-009064 | 1/2010 |
| JP | 2010-237528 | 10/2010 |

* cited by examiner (A)

(B)

DISPLAY UNIT AND ELECTRONIC APPARATUS

CROSS REFERENCES TO RELATED APPLICATIONS

The present application is a national stage of International Application No. PCT/JP2012/074550 filed on Sep. 25, 2012 and claims priority to Japanese Patent Application No. 2011-219054 filed on Oct. 3, 2011, the disclosure of which is incorporated herein by reference.

BACKGROUND

The present disclosure relates to a display unit that may use four-color sub-pixels of red (R), green (G), blue (B), and white (W), for example, for a single pixel, and to an electronic apparatus that includes such a display unit.

The most widely used method for carrying out a color image display in a display unit having a plurality of pixels is to arrange three sub-pixels corresponding to three primary colors of red (R), green (G), and blue (B) in each pixel and adjust the luminance level in each of the sub-pixels individually. Such a method allows the chromaticity point and luminance as a whole pixel to be set up at will, resulting in the color image display being achieved.

An example of such a display unit capable of performing the color image display may be a liquid crystal display unit. The liquid crystal display unit typically includes a backlight for applying white irradiation light and a liquid crystal display panel. Typically in the liquid crystal display panel, there is provided a color filter corresponding to each of colors of R, G, and B for each sub-pixel, and a polarizing plate is attached at each of the light-incoming side thereof and the light-outgoing side thereof. Consequently, the intensity of light to be emitted from the backlight decreases in the polarizing plates and the color filters, resulting in deterioration in the overall light utilization efficiency of the liquid crystal display unit. This leads to a significant energy loss in the liquid crystal display unit, causing an increase in power consumption.

Accordingly, to reduce the power consumption, a structure has been proposed that uses four-color sub-pixels for each pixel in a liquid crystal display panel (for example, see PTL 1). In concrete terms, in addition to the three-color sub-pixels of R, G, and B as described above, a sub-pixel of white (W), yellow (Y), or the like that exhibits the higher luminance than these three colors is used to carry out the image display, thereby improving the luminance efficiency to achieve the low power consumption.

Examples of such a display unit using the four-color sub-pixels may include an organic EL (Electro Luminescence) display unit in addition to the above-described liquid crystal display unit (for example, see PTL 2 to PTL 5).

CITATION LIST

Patent Literature

PTL 1: Japanese Unexamined Patent Application Publication No. H04-54207
PTL 2: Japanese Unexamined Patent Application Publication No. 2006-309118
PTL 3: Japanese Unexamined Patent Application Publication No. 2005-12905
PTL 4: Japanese Unexamined Patent Application Publication (Published Japanese Translation of PCT Application) No. JP2007-26867
PTL 5: Japanese Unexamined Patent Application Publication (Published Japanese Translation of PCT Application) No. JP2008-518400

SUMMARY

Additional features and advantages are described herein, and will be apparent from the following Detailed Description and the figures.

In the above-described organic EL display unit having the four-color sub-pixels, a white organic EL device may be often used for each sub-pixel. Therefore, each of sub-pixels of R, G, and B is provided with a color filter for selectively taking out each color light from white light, while a sub-pixel of W is not provided with such a color filter, and the white light emitted from a white light-emitting device is directly taken out. For example, in carrying out an image display using such four-color sub-pixels, unlike a case where only three-color sub-pixels of R, G, and B, for example, are used, a renewed luminance adjustment or chromaticity design is necessary to achieve the high image quality.

Accordingly, it is desirable to provide a display unit and an electronic apparatus that allow the high image quality to be achieved in carrying out an image display using four-color sub-pixels.

A display unit according to an embodiment of the present disclosure includes a plurality of pixels having first to third sub-pixels each of which corresponds to respective colors of red (R), green (G), and blue (B), and a fourth sub-pixel exhibiting higher luminance than the first to third sub-pixels. In each of the plurality of pixels, the first to fourth sub-pixels have light-emitting devices between a pair of substrates that are arranged in opposition to each other, wherein the first to third sub-pixels are provided with color filters that selectively transmit corresponding color light therethrough on the side of one substrate of a pair of the substrates, and in the fourth sub-pixel, the transmittance of light emitted from the light-emitting device is configured to be reduced at a partial or whole region of the fourth sub-pixel.

An electronic apparatus according to an embodiment of the present disclosure includes the display unit according to an embodiment of the present disclosure.

In the display unit and the electronic apparatus according to an embodiment of the present disclosure, each pixel has the first to third sub-pixels corresponding to R, G, and B, respectively, as well as the fourth sub-pixel exhibiting higher luminance than these three sub-pixels, and the first to third sub-pixels are provided with color filters. In the fourth sub-pixel, the transmittance of light emitted from the light-emitting device is configured to be reduced at a partial or whole region of the fourth sub-pixel, which reduces a difference in the transmittance among the first to third sub-pixels having the color filters and the fourth sub-pixel having no color filter. This ensures an excellent luminance balance, and makes it easy to represent desired chromaticity.

For example, when a driving substrate having a pixel driving circuit and a sealing substrate that is configured of a transparent substrate are provided as a pair of substrates, and color filters are provided on the side of the sealing substrate of these substrates, the following configuration may be preferable. That is, each of the color filters is provided at an aperture facing the first to third sub-pixels on a black matrix, and an aperture width of the black matrix in the fourth sub-pixel is smaller than each of the aperture widths in any other sub-pixels. In the fourth sub-pixel, vignetting of white light at an edge portion of the above-described aperture occurs more frequently as compared with any other sub-pixels, and the transmittance of light to be emitted especially toward an oblique direction is reduced. Here, the above-described difference in the transmittance among the sub-pixels has a tendency toward an increase with a change in the viewing angle, although such a control of the aperture width makes it easy to represent desired chromaticity especially when observation is made from the oblique direction.

According to the display unit and the electronic apparatus of an embodiment of the present disclosure, each pixel has the first to third sub-pixels that correspond to R, G, and B, respectively, and have predetermined color filters, as well as the fourth sub-pixel exhibiting higher luminance than these three sub-pixels. The fourth sub-pixel is configured in such a manner that the transmittance of light emitted from the light-emitting device is reduced at a partial or whole region of the fourth sub-pixel, and thus it is possible to reduce a difference in the transmittance among the first to third sub-pixels and the fourth sub-pixel, and to represent desired chromaticity. This allows the high image quality to be achieved in carrying out an image display using four-color sub-pixels.

DETAILED DESCRIPTION

Hereinafter, some embodiments of the present disclosure are described in details with reference to the drawings. It is to be noted that the descriptions are provided in the order given below.
1. First Embodiment (an example where a BM aperture in a W sub-pixel is made smaller in size than a BM aperture in each of R, G, and B sub-pixels)
2. Second Embodiment (an example where an ND filter is provided at the W sub-pixel)
3. Modification Example 1 (an example of a case where the display unit according to an embodiment of the present disclosure is applied to a bottom-emission method)
4. Modification Example 2 (another example of a shape of the BM aperture)
5. Modification Example 3 (an example where a Y sub-pixel is used)
6. Module and Application Examples

1. First Embodiment

Configuration

Figure 1:
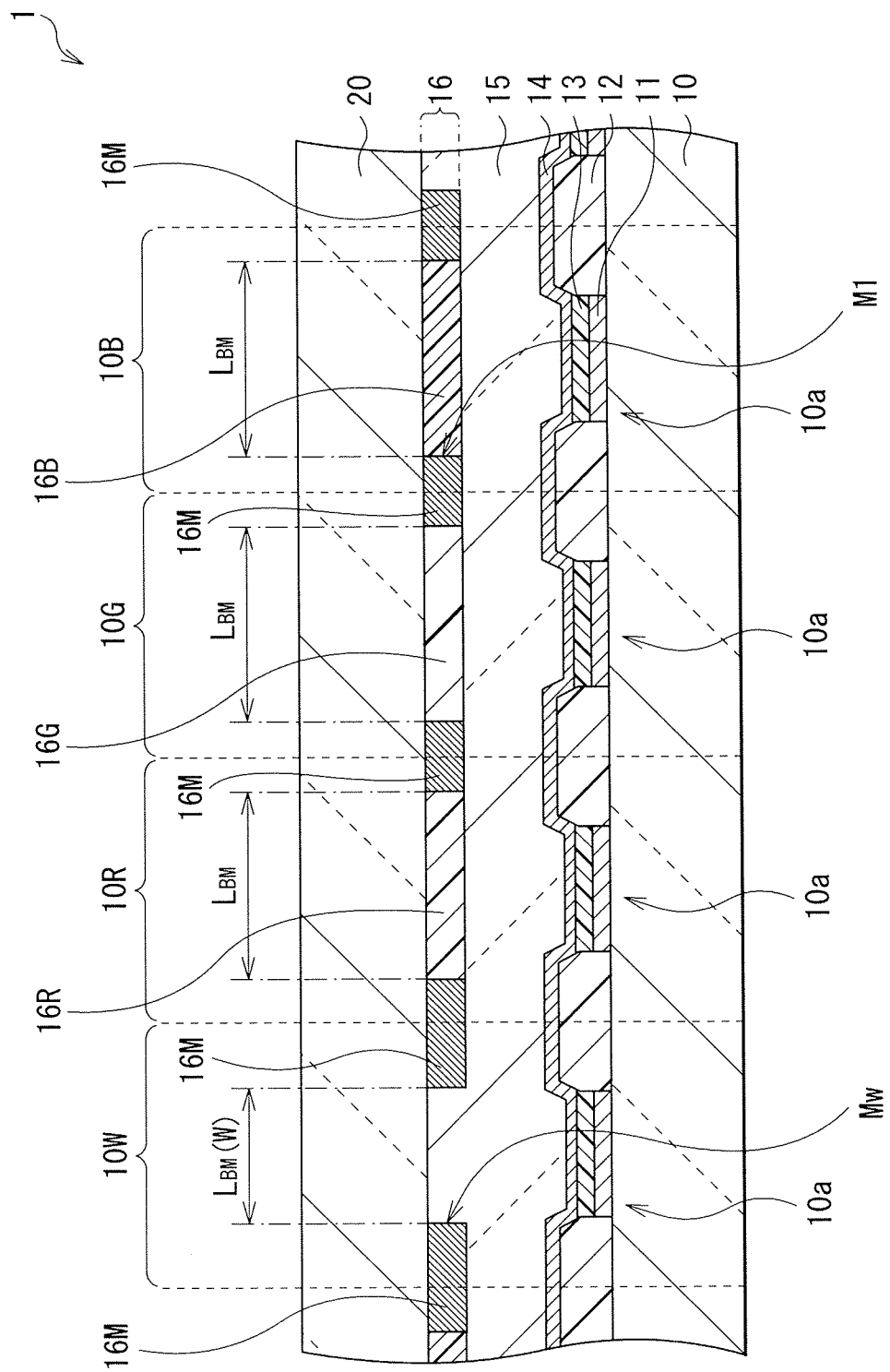
FIG. 1 is a cross-sectional view showing a simplified configuration of a display unit according to a first embodiment of the present disclosure.

FIG. 1 shows a cross-sectional configuration of a display unit (organic EL display unit 1) according to a first embodiment of the present disclosure. The organic EL display unit 1 carries out a full-color image display utilizing, for example, a top surface emission method (so-called top-emission method). The organic EL display unit 1 performs the above-described image display using four-color sub-pixels including a sub-pixel exhibiting the high luminance (for example, a white (W) sub-pixel 10W) in addition to three-primary-color sub-pixels of red (R), green (G), and blue (B) (sub-pixels 10R, 10G, and 10B). Such an organic EL display unit 1 includes a plurality of pixels (pixels P to be hereinafter described) each of which may be configured of, for example, the above-described four-color sub-pixels 10R, 10G, 10B, and 10W. These sub-pixels 10R, 10G, 10B, and 10W may be arranged in a matrix pattern, for example, on a driving substrate 10, and each of these sub-pixels may include, for example, an organic EL device (white organic EL device 10a) as a light-emitting device. These white organic EL devices 10a are sealed on the driving substrate 10 by a sealing substrate 20.

The driving substrate 10 is configured in such a manner that a pixel driving circuit (driving circuit 30) including TFTs (Tr1, Tr2, and the like to be hereinafter described) and the like are arranged on a substrate that may be made of, for example, quartz, glass, metallic foil, silicon, plastic, and the like. The surface of this driving substrate 10 is planarized by a planarizing film that is not shown in the drawing. Hereinafter, the description is provided on an example of a detailed configuration of the pixel driving circuit 10.

(Pixel Driving Circuit)

Figure 2:
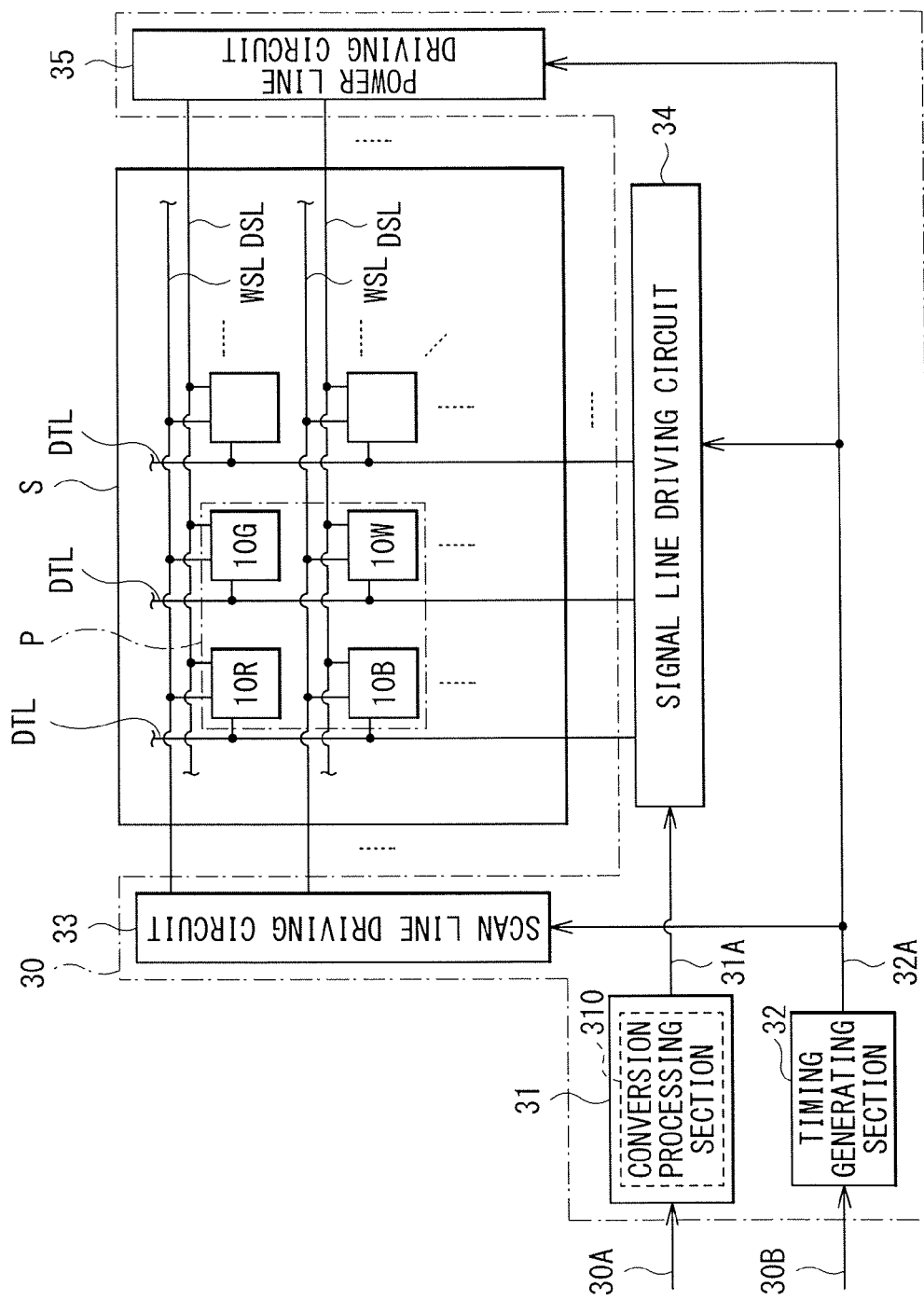
FIG. 2 is a schematic block diagram showing a driving circuit for the display unit illustrated in FIG. 1.

FIG. 2 is a schematic block diagram showing an example of a configuration of a driving circuit for each of the pixels P. On the driving substrate 10, there are provided the plurality of pixels P including the sub-pixels 10R, 10G, 10B, and 10W in a matrix pattern, and the driving circuit 30 for driving each of the sub-pixels 10R, 10G, 10B, and 10W is arranged at a peripheral region (frame region) of a display section S in which the plurality of pixels P are arranged. In the display section S, a plurality of scan lines WSL and power lines DSL are arranged in rows, and a plurality of signal lines DTL (equivalent to any of DTLr, DTLg, DTLb, and DTLw to be hereinafter described) are arranged in columns. Each of these scan lines WSL, signal lines DTL, and power lines DSL is connected with the above-described driving circuit 30. It is to be noted that the driving circuit 30 may be provided directly on the driving substrate 10, or may be alternatively integrated on a flexible printed circuit board (FPC) and the like that are connected at a peripheral region of the driving substrate 10.

Figure 3:
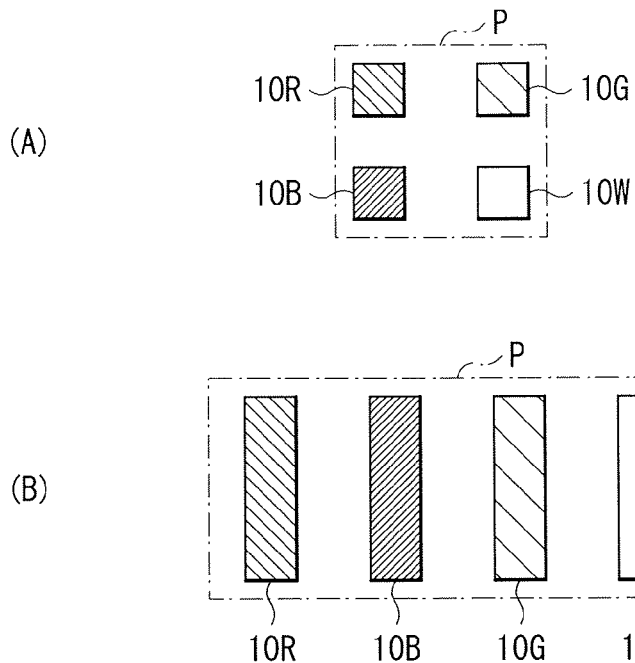
FIG. 3 is a schematic diagram for explaining an example of a layout for sub-pixels.

In each of the pixels P, the sub-pixel W is a sub-pixel (that is provided to improve the luminance of the overall display unit or to reduce the power consumption) that exhibits the higher luminance as compared with the three-primary-color sub-pixels 10R, 10G, and 10B. In each of the pixels P, these four-color sub-pixels 10R, 10G, 10B, and 10W may be provided in a 2×2 matrix as shown in an example in FIG. 3A, or may be alternatively provided along one direction (row direction or column direction) as shown in an example in FIG. 3B. In such a manner, an arrangement layout of the four-color sub-pixels 10R, 10G, 10B, and 10W is not specifically limited, although the cross-sectional view in FIG. 1 illustrates the arrangement layout in which these four-color sub-pixels 10R, 10G, 10B, and 10W are placed side by side in one direction for convenience of explanation.

The driving circuit 30 carries out a display driving of the plurality of pixels P by sequentially selecting the plurality of pixels P, and at the same time by writing an image signal voltage based on an image signal 30A to the sub-pixels 10R, 10G, 10B, and 10W in the selected pixel P. The driving circuit 30 has an image signal processing circuit 31, a timing generating circuit 32, a scan line driving circuit 33, a signal line driving circuit 34, and a power line driving circuit 35.

The image signal processing circuit 31 performs a predetermined image signal processing operation (for example, gamma correction processing, overdrive processing, and the like) for the digital image signal 30A to be input externally, and outputs an image signal 31A for which such an image signal processing has been completed to the signal line driving circuit 34. In this embodiment of the present disclosure, the image signal processing circuit 31 further has a predetermined conversion processing section 310 for carrying out the image display using the four-color sub-pixels. The conversion processing section 310 performs a conversion processing (RGB-to-RGBW conversion processing) for converting an image signal corresponding to three colors of R, G, and B, for example, into an image signal corresponding to four colors of R, G, B, and W, for example. This conversion processing section 310 may be configured using, for example, a plurality of multipliers and adders.

The timing generating circuit 32 controls the scan line driving circuit 33, the signal line driving circuit 34, and the power line driving circuit 35 to operate in conjunction with one another by generating and outputting a control signal 32A on the basis of a synchronization signal 30B to be input externally.

The scan line driving circuit 33 sequentially selects the plurality of pixels P (more specifically, the sub-pixels 10R, 10G, 10B, and 10W) by applying selection pulses sequentially to the plurality of scan lines WSL on the basis of the control signal 32A. The signal line driving circuit 34 generates an analog image signal corresponding to the image signal 31A incoming from the image signal processing circuit 31 on the basis of the control signal 32A to apply such a generated signal to each of the signal lines DTL (more specifically, the DTLr, DTLg, DTLb, and DTLw to be hereinafter described). The power line driving circuit 35 controls light emission (lighting-on) operation and light extinction (lighting-off) operation of the white organic EL device 10a in each of the sub-pixels 10R, 10G, 10B, and 10W within each of the pixels P by applying control pulses sequentially to the plurality of power lines DSL on the basis of the control signal 32A.

(Pixel Circuit)

Figure 4:
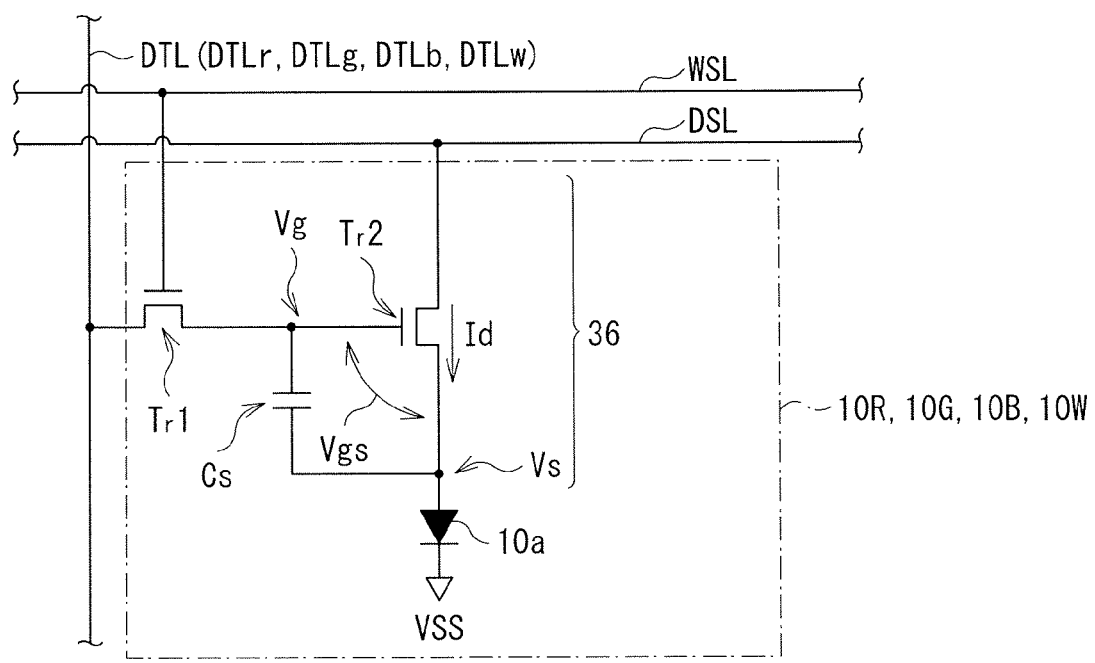
FIG. 4 is an equivalent circuit showing an example of a circuit configuration for the sub-pixels.

FIG. 4 shows an example of a circuit configuration of the sub-pixels 10R, 10G, 10B, and 10W. In each of the sub-pixels 10R, 10G, 10B, and 10W, there is provided a pixel circuit 36 along with the white organic EL device 10a.

The pixel circuit 36 may be configured to include, for example, a writing (sampling) transistor Tr1, a driving transistor Tr2, and a storage capacitor device Cs. A gate of the writing transistor Tr1 is connected with the scan line WSL, and a drain thereof is connected with the signal line DTL (DTLr, DTLg, DTLb, or DTLw). A source of the writing transistor Tr1 is connected with a gate of the driving transistor Tr2 and one end of the storage capacitor device Cs. A drain of the driving transistor Tr2 is connected with the power line DSL, and a source thereof is connected with another end of the storage capacitor device Cs and an anode of the white organic EL device 10a. A cathode of the white organic EL device 10a is set to a fixed potential VSS (for example, grounding potential). Each of the writing transistor Tr1 and the driving transistor Tr2 may be, for example, an n-channel MOS (Metal Oxide Semiconductor) TFT (Thin-Film Transistor).

It is to be noted that FIG. 4 shows the four sub-pixels 10R, 10G, 10B, and 10W collectively, although the scan line WSL and the power line DSL are connected in common to each of the sub-pixels 10R, 10G, 10B, and 10W. On the other hand, the signal line DTL is connected with each of the sub-pixels 10R, 10G, 10B, and 10W separately (signal lines DTLr, DTLg, DTLb, and DTLw).

(Configuration of Organic EL Device)

The white organic EL device 10a has an organic layer 13 that may include a light-emitting layer between a first electrode 11 and a second electrode 14, for example, on the driving substrate 10. More specifically, in the white organic EL device 10a, the first electrode 11 is provided on the driving substrate 10 for each of the sub-pixels 10R, 10G, 10B, and 10W, and the driving substrate 10 and the first electrodes 11 are covered by an inter-pixel insulating film 12 having an aperture facing each of the first electrodes 11. In the aperture of the inter-pixel insulating film 12, the organic layer 13 is formed on the first electrode 11, and the second electrode 14 is provided on the organic layer 13 over a whole area of the display region.

The first electrode 11 may function as an anode, for example, and may be configured using, for example, a conductive material excellent in the optical reflectivity. This first electrode 11 may be made of an elementary substance or an alloy of metallic elements such as chromium (Cr), gold (Au), platinum (Pt), nickel (Ni), copper (Cu), tungsten (W), aluminum (Al), or silver (Ag). Alternatively, the first electrode 11 may have a structure of stacking a metallic film (a portion functioning as a mirror) that is made of an elementary substance or an alloy of the above-described metallic elements and a transparent conductive film that is made of ITO, InZnO, an alloy of zinc oxide (ZnO) and aluminum (Al), and the like. In this embodiment of the present disclosure, in the top-emission method in which light is taken out from the upside of the sealing substrate 20, a part or all of the first electrode 11 function as a mirror, and the light emitted from the white organic EL device 10a is reflected toward the upside. A film thickness of the first electrode 11 may be preferably set up to achieve the desired reflectance (for example, reflectance of 80% to 90%).

The inter-pixel insulating film 12 has a function of electrically separating a light-emitting region for each of the sub-pixels 10R, 10G, 10B, and 10W to suppress the inter-pixel leakage. This inter-pixel insulating film 12 is configured of an organic insulating film that may be made of a material such as polyimide, acrylic resin, or novolac resin.

The organic layer 13 includes an organic electroluminescent layer (here, a white light-emitting layer), and gives rise to a recombination of electrons and holes by applying an electric field to generate white light (also including pseudo white light that is allowed to be regarded as the white light). Such a white light-emitting layer may have a structure of stacking, for example, a red light-emitting layer that emits red light, a green light-emitting layer that emits green light, and a blue light-emitting layer that emits blue light in a thickness direction. The red light-emitting layer may contain, for example, at least one kind of material from among a red luminescence material, a hole transport material, and an electron transport material, and may be configured of, for example, a material that mixes 2,6-bis[(4'-methoxydiphenylamino) styryl]-1,5-dicyanonaphthalene (BSN) with 4,4-bis(2,2-diphenylvinyl) biphenyl (DPVBi). The green light-emitting layer may contain, for example, at least one kind of material from among a green luminescence material, a hole transport material, and an electron transport material, and may be configured of, for example, a material that mixes coumarin 6 with AND or DPVBi. The blue light-emitting layer may contain, for example, at least one kind of material from among a blue luminescence material, a hole transport material, and an electron transport material, and may be configured of, for example, a material that mixes 4,4'-bis[2-{4-(N,N-diphenylamino)phenyl}vinyl]biphenyl (DPAVBi) with DPVBi.

Further, such an organic layer 13 may include, for example, a hole injection layer, a hole transport layer, an electron transport layer, and the like in addition to the above-described light-emitting layers. In concrete terms, when the first electrode 11 functions as an anode, a structure of stacking a hole injection layer, a hole transport layer, a white light-emitting layer, and an electron transport layer in this order from the first electrode 11 side may be permitted. Alternatively, an electron injection layer that may be made of, for example, LiF may be further provided between the white light-emitting layer or the electron transport layer, and the second electrode 14. Additionally, the above-described white light-emitting layer, as well as the hole injection layer, the hole transport layer, the electron transport layer, and the electron injection layer may be formed in common to the sub-pixels 10R, 10G, 10B, and 10W, or may be provided for each of the sub-pixels 10R, 10G, 10B, and 10W. Alternatively, some of these layers may be provided for each of the sub-pixels, and any other layers may be provided in common to all the sub-pixels.

It is to be noted that a structure of stacking the red light-emitting layer, the green light-emitting layer, and the blue light-emitting layer as the white light-emitting layer is illustrated by an example here, although a configuration of the white light-emitting layer is not limited thereto, but a structure capable of generating white light by means of color mixture may be permitted. For example, a structure of stacking a blue light-emitting layer and a yellow light-emitting layer or a structure of stacking a blue light-emitting layer and an orange light-emitting layer may be permitted.

The second electrode 14 may function as a cathode, for example, and may be provided, for example, in common to the sub-pixels 10R, 10G, 10B, and 10W. This second electrode 14 may be configured of, for example, an elementary metal that is made of at least one kind of material from among aluminum (Al), magnesium (Mg), calcium (Ca), and silver (Ag), as well as transparent conductive films and the like of ITO, InZnO, ZnO, and the like, an alloy containing two or more kinds of these metal materials, or a metal oxide. The second electrode 14 may be a single-layer film that is made of either such an elementary metal or an alloy, or may be a laminated film that stacks two or more kinds of these metal materials. This second electrode 14 is provided in a state of being insulated from the first electrode 11, and is covered with a protective film 15.

The protective layer 15 may be configured of either an insulating material or a conductive material. For the insulating material, an inorganic amorphous insulating material such as amorphous silicon (a-Si), amorphous silicon carbide (a-SiC), amorphous silicon nitride (a-$Si_{1-x}N_X$), amorphous carbon (a-C), and the like may be preferable. Such an inorganic amorphous insulating material has low water permeability because it does not configure a grain, and thus becomes an excellent protective film. On this protective layer 15, the sealing substrate 20 is bonded with a bonding layer that is not shown in the drawing in between.

The sealing substrate 20 seals each of the white organic EL devices 10a. In this embodiment of the present disclosure, the top-emission method is used as described previously, and thus this sealing substrate 20 is made of a material such as a transparent glass that transmits each color light therethrough that is generated in the sub-pixels 10R, 10G, 10B, and 10W. This sealing substrate 20 is provided with a color filter layer 16.

(Color Filter Layer 16)

The color filter layer 16 has a black matrix 16M having apertures (apertures M1 and Mw) in opposition to each of the sub-pixels 10R, 10G, 10B, and 10W. More specifically, in the color filter layer 16, the black matrix 16M has the aperture M1 in opposition to each of the sub-pixels 10R, 10G, and 10B, and the aperture Mw in opposition to the sub-pixel 10W. This black matrix 16M may be made of, for example, a resin material with a black pigment or dye mixed in. Alternatively, the black matrix 16M may be configured of, for example, a thin-film filter that laminates one or more layers of thin film made of a metal, metallic nitride, or metallic oxide.

Only at the aperture M1 facing the sub-pixels 10R, 10G, and 10B between the apertures M1 and Mw of the black matrix 16M, there is formed a color filter (red filter 16R, green filter 16G, or blue filter 16B). In other words, each of the sub-pixels 10R, 10G, and 10B is provided with the corresponding color filter (red filter 16R, green filter 16G, or blue filter 16B), but the sub-pixel 10W is not provided with a color filter.

The red filter 16R selectively transmits red light in white light therethrough (has a transmission band within a wavelength range of 620 to 750 nm, for example). The green filter 16G selectively transmits green light in white light therethrough (has a transmission band within a wavelength range of 495 to 570 nm, for example). The blue filter 16B selectively transmits blue light in white light therethrough (has a transmission band within a wavelength range of 450 to 495 nm, for example). Each of the red filter 16R, the green filter 16G, or the blue filter 16B may be made of, for example, a resin material with a black pigment or dye mixed in. It is to be noted that the surface of such a color filter layer 16 may be covered with an overcoating film that is made of an organic insulating material.

With such a configuration, the white light from the white organic EL device 10a side is converted into each color light of R, G, and B in the sub-pixels 10R, 10G, and 10B, respectively to be extracted as display light, while the white light passes through the aperture Mw as it is (without being subject to color conversion) in the sub-pixel 10W to be extracted as display light. In this embodiment of the present disclosure, the design is made in such a manner that aperture widths of the apertures M1 and Mw in the black matrix 16M of such a color filter layer 16 have a predetermined magnitude relationship.

(Aperture Design of Black Matrix)

FIGS. 5A and 5B show detailed cross-sectional configurations of the sub-pixel 10B and the sub-pixel 10W, respectively. Each of FIG. 6 and FIG. 7 schematically shows an example of a shape and a layout of the apertures.

In this embodiment of the present disclosure, the design is made in such a manner that a width of the aperture Mw (aperture width $L_{BM}$(W)) facing the sub-pixel 10W is smaller than a width of the aperture M1 (aperture width $L_{BM}$) facing the sub-pixels 10R, 10G, and 10B. In concrete terms, in the sub-pixels 10R, 10G, and 10B (hereinafter, the description is provided by taking the sub-pixel 10B as an example), as shown in FIG. 5A, the aperture M1 is provided on the white organic EL device 10a, and the blue filter 16B is formed at this aperture M1. Here, the aperture M1 is typically provided to be larger in size than the pixel aperture (a portion corresponding to the first electrode 11). This is due to the following reason.

That is, in the organic EL display unit 1 of the top-emission method, the color filter layer 16 including the black matrix 16M is provided on the sealing substrate 20 side. In such a configuration, the reason for the above is that the alignment accuracy at the time of bonding with the driving substrate 10 is maintained (a margin that absorbs an influence of a positional shift is assured), and shading (so-called vignetting) that may be found when a display surface (here, a top surface of the sealing substrate 20) is viewed from an oblique direction is suppressed to improve the viewing angle characteristics at each sub-pixel. Here, a shading ratio Z in a given observation direction (an oblique direction that is inclined at an angle $\theta_1$ (0 degrees$\leq\theta_1<$90 degrees) from a normal direction of the substrate) may be determined by the following Expression (1) and Expression (2), for example. In other words, in the sub-pixels 10R, 10G, and 10B corresponding to three colors of R, G, and B, the aperture width $L_{BW}$ is designed to ensure that the shading ratio Z is minimized in the black matrix 16M. More specifically, the design is made to achieve the shading ratio Z that ensures to reduce an influence of the vignetting, while keeping the shading performance to the degree of being capable of suppressing crosstalk of color light from adjacent pixels, reflection of outside light, and the like.

$$L_{shadow} = \Sigma i [t_i * \tan\{\sin^{-1}(n_{air} * \sin\theta_{air}/n_{sub(i)})\}] \quad (1)$$

$$Z = (L_P + d - L_{shadow})/L_P \quad (2)$$

where
$L_{shadow}$: a shading width
$t_i$: a thickness of each layer that is laminated between a metal reflective surface of the first electrode 11 and the black matrix 16M

$n_{sub(i)}$: the refractive index of each layer that is laminated between a metal reflective surface of the first electrode 11 and the black matrix 16M
$n_{air}$: the refractive index of the air
$L_P$: a width of the first electrode 11 (pixel width)
d: a difference between the aperture width $L_{BM}$ and the pixel width $L_P$ (aperture margin)

On the other hand, the transmittance T of the color filters in an oblique direction is represented as indicated by Expressions (A) and (B) on the basis of the Snell's law and the Lambert-Beer's law. It is to be noted that a symbol "^" in Expression (A) denotes "exponentiation", and for example, "B^2" means "$B^2$". In other words, when the transmittance of the color filters is different, a difference in the transmittance becomes larger with an increase in an observing angle $\theta_1$, and a change in the chromaticity in the oblique direction occurs.

$$T = T_0 \char`\^(1/\cos\theta_2) \quad (A)$$

$$\sin\theta_1/\sin\theta_2 = n_{CF} \quad (B)$$

where
$T_\theta$: the transmittance at the front side of the color filter (16R, 16G, or 16B)
$\theta_2$: a light beam transmission angle in the color filter (16R, 16G, or 16B)
$\theta_1$: an observing angle (viewing angle)
$n_{CF}$: a ratio of the refractive index of the observation environment to that of the color filter (16R, 16G, or 16B)

Meanwhile, as shown in FIG. 5B, in the sub-pixel 10W, as with any other sub-pixels (the sub-pixel 10B in this case), the aperture Mw is provided on the white organic EL device 10a, and the aperture Mw is also provided to be larger in size than the pixel width $L_P$ for the same reason as above. However, the aperture width $L_{BM}$(W) of the aperture Mw facing the sub-pixel 10W is smaller than the above aperture width $L_{BM}$.

As described above, in this embodiment of the present disclosure, in the sub-pixel 10W, the aperture width $L_{BM}$(W) is set up to be smaller than the aperture width $L_{BM}$ in any other sub-pixels, and thus the shading ratio Z increases to reduce the transmittance. On this occasion, however, the aperture width $L_{BM}$(W) may be preferably set up in consideration of the transmittance T of each of the red filter 16R, the green filter 16G, and the blue filter 16B in each of the sub-pixels 10R, 10G, and 10B (in such a manner that the transmittance in the sub-pixel 10W becomes equivalent to the transmittance T of each color filter). It is to be noted that the transmittance $T_0$ in Expression (A) given above may vary depending on a density, thickness, and the like of a color filter material, and may be different for each of the sub-pixels 10R, 10G, and 10B.

Here, because the pixel width $L_P$ in each of the four-color sub-pixels 10R, 10G, 10B, and 10W is identical to one another, an aperture margin $d_W$ in the sub-pixel 10W is designed to be smaller (narrower) than the aperture margin d of the sub-pixel 10B. As a result, in the sub-pixel 10W, the shading ratio Z that is defined by the above Expressions (1) and (2) becomes larger than that in the sub-pixel 10B, and such a tendency increases with an increase in the observing angle $\theta_1$ as described in details hereinafter.

In practice, as shown in FIG. 6 and FIG. 7, a shape of the pixel (a planar shape of the first electrode 11) may be, for example, in the square form (rectangular or quadrate form). In such a manner, when the aperture margin d is provided along each of X direction and Y direction in the sub-pixels 10R, 10G, and 10B, the aperture margin $d_W$ may be also provided along each of X direction and Y direction in the sub-pixel 10W as well. In concrete terms, in the sub-pixels 10R, 10G, and 10B, the design is made to provide an aperture width $L_{BM}1$ considering the aperture margin d with respect to the pixel width $L_P1$ in X direction and an aperture width $L_{BM}2$ considering the aperture margin d with respect to the pixel width $L_P2$ in Y direction. On the other hand, in the sub-pixel 10W, the design is made to provide an aperture width $L_{BM}(W)1$ considering the aperture margin $d_W$ with respect to the pixel width $L_P1$ in X direction and an aperture width $L_{BM}(W)2$ considering the aperture margin $d_W$ with respect to the pixel width $L_P2$ in Y direction. It is to be noted that X direction and Y direction are two directions orthogonal to each other in the plane parallel to the display surface (substrate surface).

It is to be noted that, for the sub-pixels 10R, 10G, and 10B corresponding to three colors of R, G, and B, the aperture widths $L_{BM}$ and the aperture margins d are set up to be identical to one another here, although the aperture widths $L_{BM}$ and the aperture margins d may be not necessarily the same among each of the sub-pixels. Also among the red filter 16R, the green filter 16G, and the blue filter 16B, the transmission band may be different from one another, and a difference may be sometimes made in the transmittance (especially the transmittance in an oblique direction) among the sub-pixels depending on any other design requirements such as the density of a pigment. Therefore, to reduce such a difference in the transmittance, the design may be made in such a manner that the aperture width in any one of the sub-pixels 10R, 10G, and 10B is smaller (or larger) than that in each of the other sub-pixels, or the aperture width in each of the sub-pixels 10R, 10G, 10B, and 10W is different from one another (for each transmission wavelength). Examples of such a design may include a design in a method of adjusting the transmittance at transmission wavelength band for each of R, G, and B in correlation to the density of each color filter (in consideration of the density of each color filter). In such a manner, even when there is a difference in the transmittance among each of the sub-pixels 10R, 10G, and 10B, such a difference is reduced to achieve the desired chromaticity more easily.

Further, the aperture margins d and dw are set up to be the same in width in each of X direction and Y direction, although they may be alternatively set up to be different in each direction. For example, only the aperture widths in one selective direction (for example, a direction corresponding to a horizontal direction) in X direction and Y direction may be adjusted, and the aperture widths may be set up to be the same among four sub-pixels in the other direction (for example, a direction corresponding to a vertical direction). Alternatively, a ratio of adjustment of the aperture widths may be different in X direction and Y direction. In such a manner, it is possible to carry out an aperture control (transmittance control) selectively only in a direction especially involving the excellent viewing angle characteristics (chromaticity), and it is possible to achieve the effect of suppressing the reflectivity without reducing the aperture width in the sub-pixel 10W in another direction.

[Function and Advantageous Effects]

In the organic EL display unit 1, as shown in FIG. 2 and FIG. 4, the driving circuit 30 drives each of the pixels P in the display section S on the basis of the image signal 30A and the synchronization signal 30B to perform a display driving using the four-color sub-pixels 10R, 10G, 10B, and 10W. On this occasion, the image signal processing circuit 31 carries out the conversion processing operation as described below for the image signal 30A corresponding to three colors of R, G, and B to generate an image signal to be provided to each of the sub-pixels 10R, 10G, 10B, and 10W.

(RGB-to-RGBW Conversion Processing of Image Signal)

Figure 8:
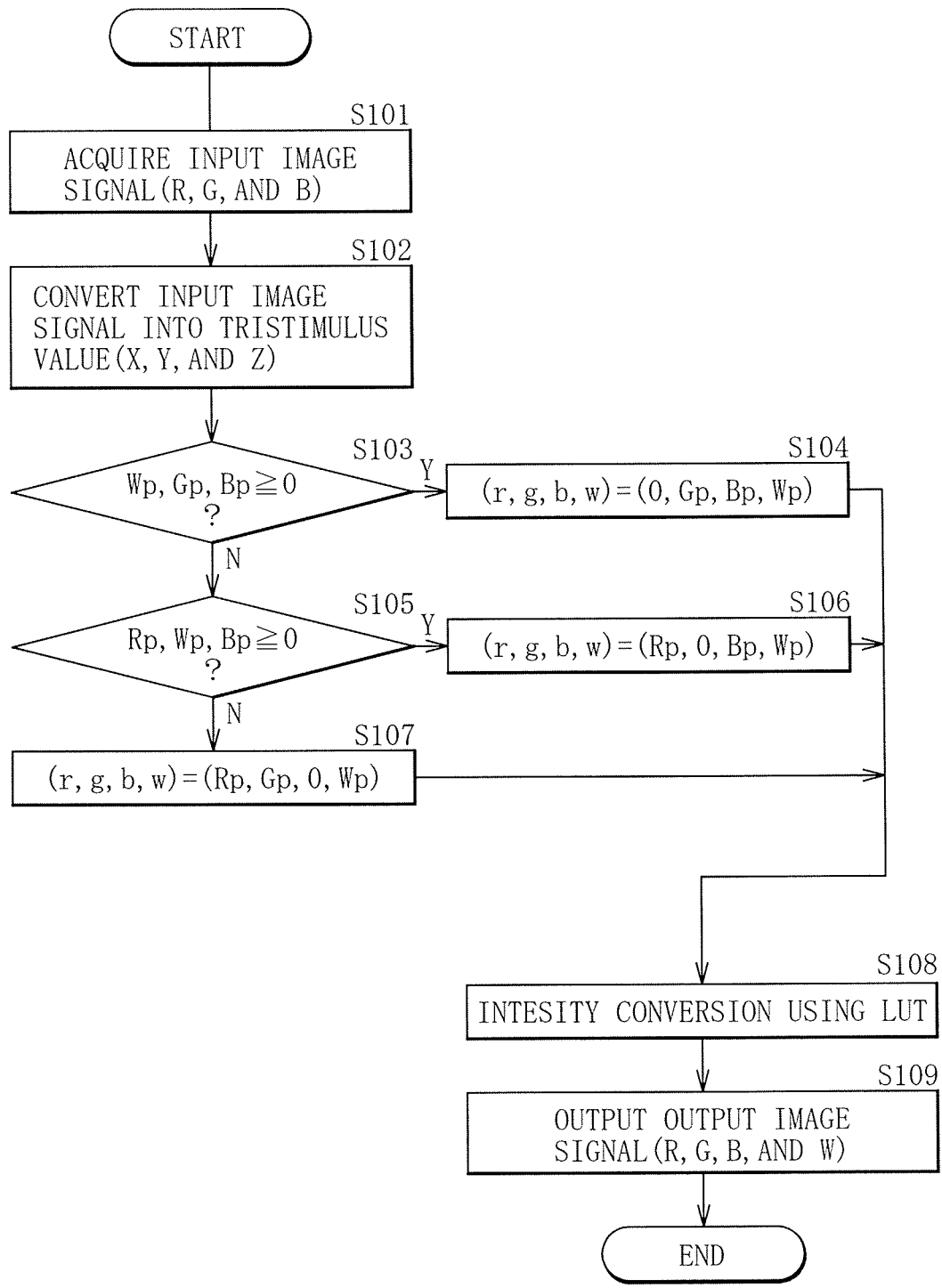
FIG. 8 is a flowchart for explaining an example of a conversion processing operation.

Here, the incoming image signal 30A typically corresponds to three colors of R, G, and B, and thus to start with, the image signal processing circuit 31 carries out the following conversion processing operation (RGB-to-RGBW conversion processing) for the incoming image signal 30A (image signal corresponding to three colors of R, G, and B). FIG. 8 shows a processing flow in this conversion processing section 310.

That is, to start with, the conversion processing section 310 acquires the image signal (input image signal (R, G, and B)) corresponding to three colors of R, G, and B (step S101). Next, the conversion processing section 310 converts this input image signal (R, G, and B) into an image signal (X, Y, and Z) corresponding to a tristimulus value that is a color coordinate system specified by CIE (Commission Internationale de l'Eclairage) (step S102).

In concrete terms, panel-specific saturation colors of R, G, and B are measured beforehand, and a transformation matrix M that may be defined by Expression (3) below, for example, is determined on the basis of this measurement result. Subsequently, a mixing ratio (r, g, and b) in a desired white point (assumed to be a white point A) in a case of the use of the pixels (sub-pixels 10R, 10G, and 10B) that determines a color gamut is obtained on the basis of Expression (4) below using an inverse matrix $M^{-1}$ of this transformation matrix M. The mixing ratio (r, g, and b) that is determined in such a manner is used to convert the input image signal (R, G, and B) into the image signal (X, Y, and Z) on the basis of Expressions (5) and (6) given below.

[Expression 1]

$$M = \begin{bmatrix} Rx/Ry & Gx/Gy & Bx/By \\ 1 & 1 & 1 \\ Rz/Ry & Gz/Gy & Bz/By \end{bmatrix} \quad (3)$$

$$\begin{pmatrix} r \\ g \\ b \end{pmatrix} = M^{-1} \begin{pmatrix} Wx/Wy \\ 1 \\ Wz/Wy \end{pmatrix} \quad (4)$$

$$\begin{pmatrix} X \\ Y \\ Z \end{pmatrix} = \begin{pmatrix} r(Rx/Ry) & g(Gx/Gy) & b(Bx/By) \\ r & g & b \\ r(Rz/Ry) & g(Gz/Gy) & b(Bz/By) \end{pmatrix} \begin{pmatrix} \Gamma^{-1}(R) \\ \Gamma^{-1}(G) \\ \Gamma^{-1}(B) \end{pmatrix} \quad (5)$$

$$\Gamma^{-1}(x) = (x/255)^{2.2} \quad (6)$$

It is to be noted that, in the above expressions, Rx, Gx, Bx, and Wx are values corresponding to the x-coordinate of the chromaticity representing saturation colors of the sub-pixels 10R, 10G, 10B, and 10W, respectively, and Ry, Gy, By, and Wy are values corresponding to the y-coordinate of the chromaticity representing saturation colors of the sub-pixels 10R, 10G, 10B, and 10W, respectively, while Rz, Gz, Bz, and Wz denote values corresponding to the z-coordinate (that is, 1−x−y) of the chromaticity representing saturation colors of the sub-pixels 10R, 10G, 10B, and 10W, respectively.

Further, the input image signal (R, G, and B) may be, for example, an 8-bit or 16-bit image signal for each color, and may represent the intensity of each color in accordance with a gamma function such as the power of 2.2, although this input image signal is not limited thereto provided that it specifies a luminescent chromaticity point and luminance of each sub-pixel. Additionally, a method of converting the input image signal (R, G, and B) into the image signal (X, Y, and Z)

is not limited to the above-described method, but any other publicly known method may be used alternatively. In addition, the above-described white point A is not limited to a single point, but the plurality of white points A may be set up, and the transformation matrix M for the plurality of white points A may be determined. Moreover, the transformation matrix M may be determined for the pixels P in a whole area of the display section S within the panel, or for the pixel P or a selective region (including the plurality of pixels) as a target.

Next, the conversion processing section 310 generates an image signal (converted image signal (r, g, b, and w)) that is capable of representing the chromaticity expressed by the image signal (X, Y, and Z) corresponding to the tristimulus value, by means of the four-color sub-pixels 10R, 10G, 10B, and 10W of R, G, B, and W including the sub-pixel 10W.

In concrete terms, to start with, a panel-specific saturation color is measured beforehand for W in addition to R, G, and B, and transformation matrixes Mr, Mg, and Mb that are defined by the following Expressions (7) to (9) are determined based on the measurement result. It is to be noted that these transformation matrixes Mr, Mg, and Mb are derived from each of combinations of (W, G, and B), (R, W, and B), and (R, G, and W) in each of saturation colors of R, G, B, and W.

[Expression 2]

$$Mr = \begin{bmatrix} Wx/Wy & Gx/Gy & Bx/By \\ 1 & 1 & 1 \\ Wz/Wy & Gz/Gy & Bz/By \end{bmatrix} \quad (7)$$

$$Mg = \begin{bmatrix} Rx/Ry & Wx/Wy & Bx/By \\ 1 & 1 & 1 \\ Rz/Ry & Wz/Wy & Bz/By \end{bmatrix} \quad (8)$$

$$Mb = \begin{bmatrix} Rx/Ry & Gx/Gy & Wx/Wy \\ 1 & 1 & 1 \\ Rz/Ry & Gz/Gy & Wz/Wy \end{bmatrix} \quad (9)$$

Subsequently, a combination in which any of values becomes 0 (zero) or more is determined from among each of combinations of (Wp, Gp, and Bp), (Rp, Wp, and Bp), and (Rp, Gp, and Wp) on the basis of the following Expressions (10) to (15) using inverse matrixes $Mr^{-1}$, $Mg^{-1}$, and $Mb^{-1}$ of the transformation matrixes Mr, Mg, and Mb and the image signal (X, Y, and Z). Thereafter, an image signal for a color (any of R, G, and B) that is not included in this combination is set at 0 to generate the converted image signal (r, g, b, and w) corresponding to four colors of R, G, B, and W.

[Expression 3]

$$\begin{pmatrix} Wp \\ Gp \\ Bp \end{pmatrix} = Mr^{-1} \begin{pmatrix} Px/Py \\ 1 \\ Pz/Py \end{pmatrix} \quad (10)$$

$$\begin{pmatrix} Rp \\ Wp \\ Bp \end{pmatrix} = Mg^{-1} \begin{pmatrix} Px/Py \\ 1 \\ Pz/Py \end{pmatrix} \quad (11)$$

$$\begin{pmatrix} Rp \\ Gp \\ Wp \end{pmatrix} = Mb^{-1} \begin{pmatrix} Px/Py \\ 1 \\ Pz/Py \end{pmatrix} \quad (12)$$

-continued $$\begin{cases} Px = X/(X+Y+Z) & (13) \\ Py = Y/(X+Y+Z) & (14) \\ Pz = Z/(X+Y+Z) & (15) \end{cases}$$

For example, to start with, a combination of (Wp, Gp, and Bp) is calculated on the basis of Expressions (10) and (13) to (15) to determine whether or not each value of Wp, Gp, and Bp is 0 or more. If all the values of Wp, Gp, and Bp become 0 or more (step S103: Y), an image signal (0, Gp, and Bp) in which an image signal for R is replaced by 0 is used as the converted image signal (r, g, b, and w) (step S104).

On the contrary, if any value of Wp, Gp, and Bp is less than 0 (step S103: N), a combination of (Rp, Wp, and Bp) is calculated on the basis of Expressions (11) and (13) to (15) to determine whether or not each value of Rp, Wp, and Bp is 0 or more (step S105). As this result, if all the values of Rp, Wp, and Bp are 0 or more (step S105: Y), an image signal (Rp, 0, Bp, and Wp) in which an image signal for G is replaced by 0 is used as the converted image signal (r, g, b, and w) (step S106). On the other hand, if any value of Rp, Wp, or Bp is less than 0 (step S105: N), a combination of (Rp, Gp, and Wp) is calculated on the basis of Expressions (12) and (13) to (15), and an image signal (Rp, Gp, 0, and Wp) in which an image signal for B is replaced by 0 is used as the converted image signal (r, g, b, and w) (step S107).

[Expression 2]

$$Mr = \begin{bmatrix} Wx/Wy & Gx/Gy & Bx/By \\ 1 & 1 & 1 \\ Wz/Wy & Gz/Gy & Bz/By \end{bmatrix} \quad (7)$$

$$Mg = \begin{bmatrix} Rx/Ry & Wx/Wy & Bx/By \\ 1 & 1 & 1 \\ Rz/Ry & Wz/Wy & Bz/By \end{bmatrix} \quad (8)$$

$$Mb = \begin{bmatrix} Rx/Ry & Gx/Gy & Wx/Wy \\ 1 & 1 & 1 \\ Rz/Ry & Gz/Gy & Wz/Wy \end{bmatrix} \quad (9)$$

[Expression 3]

$$\begin{pmatrix} Wp \\ Gp \\ Bp \end{pmatrix} = Mr^{-1} \begin{pmatrix} Px/Py \\ 1 \\ Pz/Py \end{pmatrix} \quad (10)$$

$$\begin{pmatrix} Rp \\ Wp \\ Bp \end{pmatrix} = Mg^{-1} \begin{pmatrix} Px/Py \\ 1 \\ Pz/Py \end{pmatrix} \quad (11)$$

$$\begin{pmatrix} Rp \\ Gp \\ Wp \end{pmatrix} = Mb^{-1} \begin{pmatrix} Px/Py \\ 1 \\ Pz/Py \end{pmatrix} \quad (12)$$

$$\begin{cases} Px = X/(X+Y+Z) & (13) \\ Py = Y/(X+Y+Z) & (14) \\ Pz = Z/(X+Y+Z) & (15) \end{cases}$$

Subsequently, the converted image signal (r, g, b, and w) that is generated in the above-described manner is converted into a desired value (luminescent intensity) using, for example, a predetermined lookup table (LUT) (step S108). In such a manner, an image signal (image output signal (R, G, B, and W)) to be provided to each of the sub-pixels 10R, 10G, 10B, and 10W is generated and output (step S109). However, such a luminescent intensity conversion may be carried out by a calculation using gamma curves or approximate expressions instead of use of the LUT. Alternatively, a conversion processing of this step S108 may be omitted. The steps described thus far complete the conversion processing of the conversion processing section 310.

(Light Emission Driving Operation)

Next, the description is provided on a light emission driving operation based on the image signal as described above. More specifically, during a period of time when an image signal voltage corresponding to any of four colors that is generated by the above-described conversion processing operation is applied to the signal line DTL, and a predetermined voltage is applied to the power line DSL, the scan line driving circuit 33 raises a voltage of the scan line WSL from OFF voltage up to ON voltage. This turns on the writing transistor Tr1, and a gate potential Vg of the driving transistor Tr2 increases up to the image signal voltage. As a result, the image signal voltage is written to the auxiliary capacitor device Cs to be held thereon. It is to be noted that, in this stage, any current has not yet flown between the anode and cathode of the white organic EL device 10a (the white organic EL device 10a emits no light). A current Id to be provided from the driving transistor Tr2 flows through a capacitor device (not shown in the drawing) that is present between the anode and cathode of the white organic EL device 10a to charge this capacitor device.

Subsequently, when the scan line driving circuit 33 lowers the voltage of the scan line WSL from ON voltage down to OFF voltage, the writing transistor Tr1 turns off, and a gate of the driving transistor Tr2 is put in a floating state. As a result, the current Id flows between the drain and source of the driving transistor Tr2 to increase the source potential Vs and the gate potential Vg. This increases an anode voltage in the white organic EL device 10a, and a drive current (the current Id) depending on the image signal voltage (gate-source voltage Vgs) that is held on the auxiliary capacitor device Cs flows between the anode and cathode.

As a result, a drive current is injected into the white organic EL device 10a in each of the sub-pixels 10R, 10G, 10B, and 10W, and holes and electrons are recombined in a light-emitting layer (white light-emitting layer) within the organic layer 13 to generate white light. The light that is emitted toward the upper side (sealing substrate 20 side) in this white light moves on to the color filter layer 16 as it is, while the light that is emitted toward the lower side (driving substrate 10 side) is reflected toward the upper side at the first electrode 11, and thereafter moves on to the color filter layer 16. In such a manner, the white light comes into the color filter layer 16 in each of the sub-pixels 10R, 10G, 10B, and 10W.

Here, in the color filter layer 16, at the black matrix 16M, there are provided the apertures M1 in opposition to the sub-pixels 10R, 10G, and 10B, as well as the corresponding color filters (red filter 16R, green filter 16G, and blue filter 16B), and the apertures Mw (no color filters are provided) in opposition to the sub-pixel 10W. Consequently, in the sub-pixels 10R, 10G, and 10B, the white light from the white organic EL device 10a side passes through each of the red filter 16R, the green filter 16G, or the blue filter 16B, and each color light of red, green, and blue is extracted as the display light from the top surface side (sealing substrate 20 side). On the other hand, in the sub-pixel 10W, the above-described white light is extracted as it is from the top surface side as the display light. In such a manner, in the organic EL display unit 1, a full-color image display is carried out. Further, the image display is performed as described above using the four-color sub-pixels 10R, 10G, 10B, and 10W, and thus the luminance efficiency is improved to achieve low power consumption as compared with a case where the three-color sub-pixels of R, G, and B are only used.

(Function Achieved by Shape of Aperture on Black Matrix)

As described above, in the sub-pixels 10R, 10G, and 10B, the white light from the white organic EL device 10a side is transmitted through the corresponding color filters (16R, 16G, and 16B) to be extracted as the display light of R, G, and B respectively, while the white light is extracted as it is in the sub-pixel 10W as the display light.

Therefore, in the sub-pixels 10R, 10G, and 10B, only the color light at a specific band in the white light from the white organic EL device 10a is selectively extracted by the color filters (16R, 16G, and 16B), and thus the transmittance (luminance) of the display light is reduced as compared with the sub-pixel 10W exhibiting the high luminance that has no color filter. In other words, a difference in the transmittance is made among the sub-pixels 10R, 10G, and 10B of R, G, and B and the sub-pixel 10W of W. More specifically, the transmittance becomes within the range of about 75 to 85% in the sub-pixels 10R, 10G, and 10B, and comes close to 100% in the sub-pixel 10W. Such a difference in the transmittance would lose a balance of the luminance between each color, which will make it difficult to represent the desired chromaticity.

Further, in the color filters (16R, 16G, and 16B) that are formed at the apertures M1 of the black matrix 16M, a length of optical path may be different depending on the light transmission direction (travelling direction of light passing through the filters). Consequently, in an oblique direction involving a longer length of optical path (direction that is inclined from a front direction (normal direction of the substrate)), it is likely that the amount of the transmitted light will decrease as compared with the front direction. Therefore, the sub-pixels 10R, 10G, and 10B have a tendency toward a decrease in the transmittance especially in the oblique direction. On the other hand, the sub-pixel 10W is not provided with such a color filter, and thus the transmittance does not decease significantly even in the oblique direction. In other words, especially in the oblique direction, a difference in the transmittance among the sub-pixels 10R, 10G, and 10B and the sub-pixel 10W becomes prominent, and the chromaticity point is further shifted from that in the front direction, causing the viewing angle characteristics to deteriorate.

On the other hand, as described above, the transmittance in the oblique direction is basically determined by the shading ratio Z that is represented by the above Expressions (1) and (2), as well as a material, density, and the like for each of the color filters (16R, 16G, and 16B) in the sub-pixels 10R, 10G, and 10B, and is basically determined by the shading ratio Z in the sub-pixel 10W.

Figure 5:
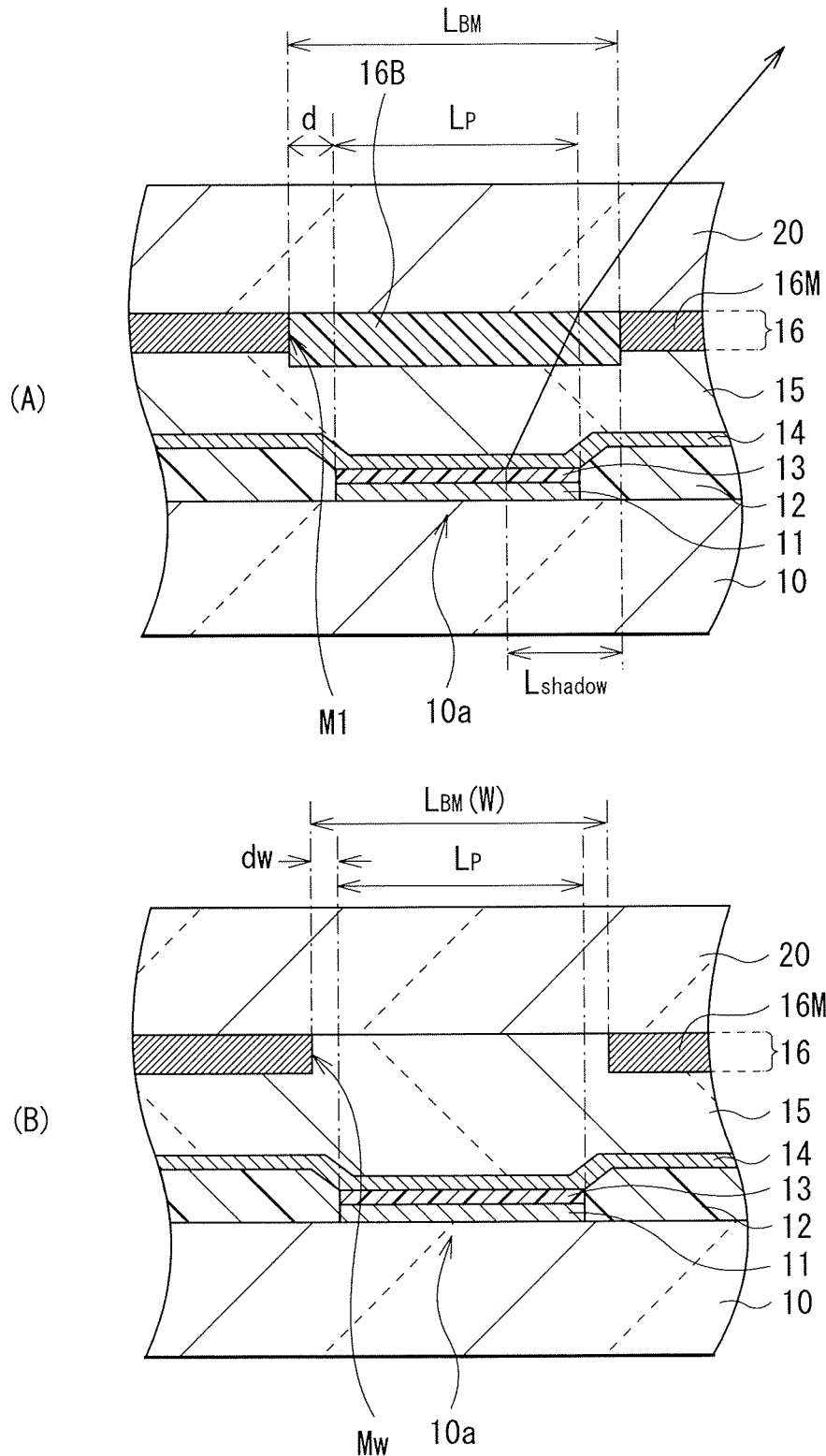
FIGS. 5A and 5B are each a cross-sectional view showing a detailed configuration of a sub-pixel (blue) and a sub-pixel (white), respectively.
Figure 6:
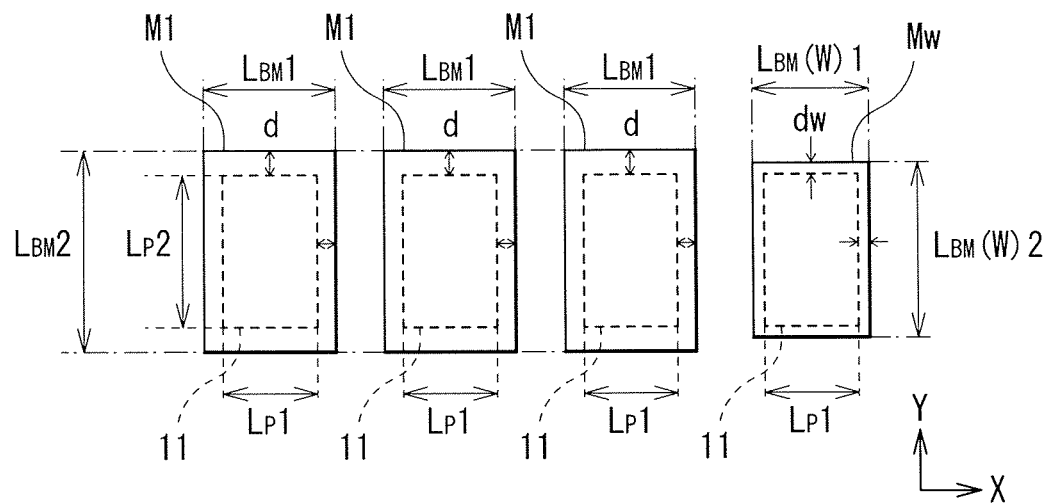
FIG. 6 is a schematic plan view for explaining an example of a configuration for apertures of a black matrix.
Figure 7:
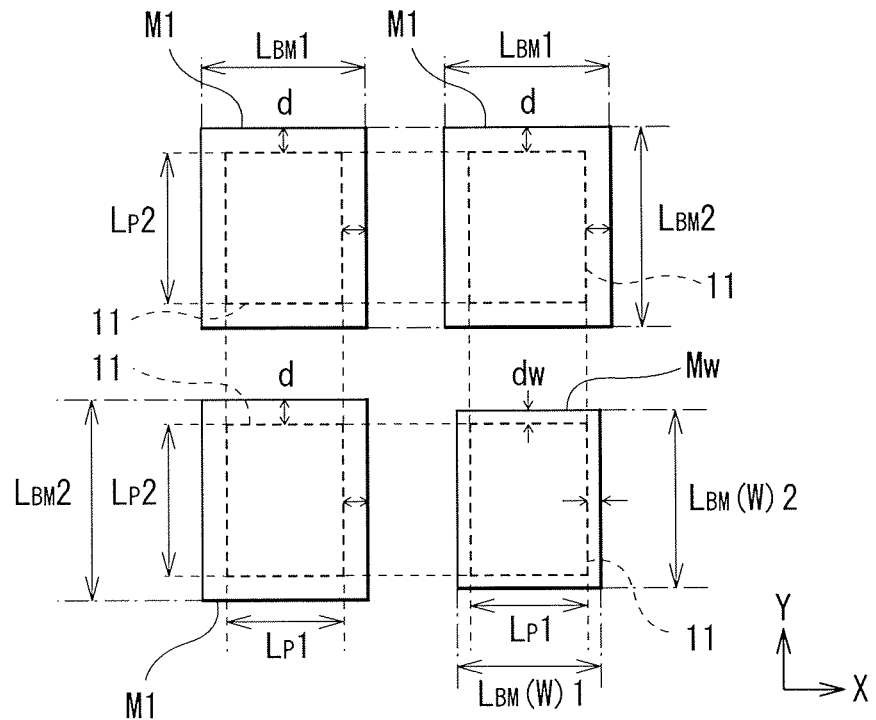
FIG. 7 is a schematic plan view for explaining another example of a configuration for apertures of the black matrix.
Figure 9:
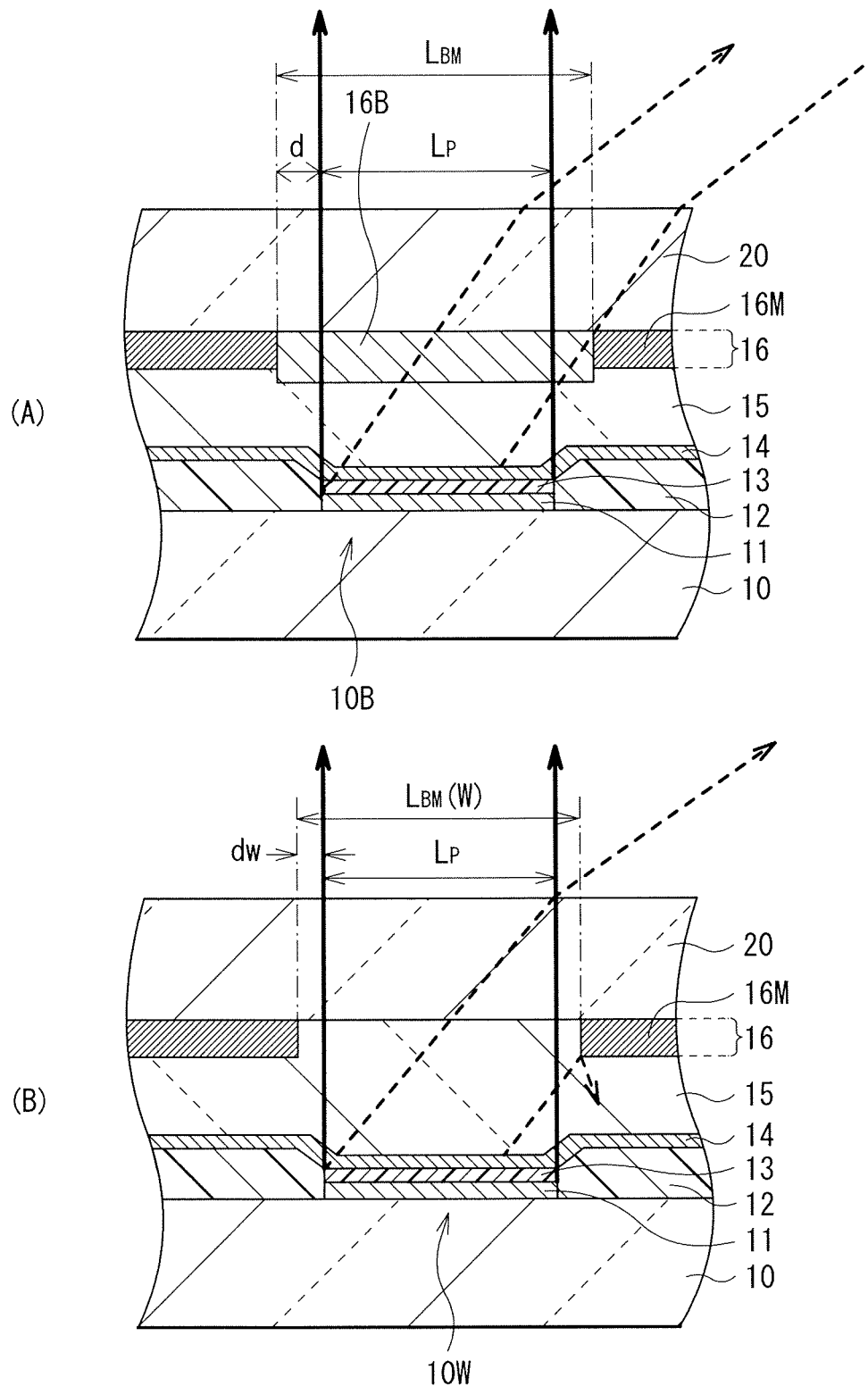
FIGS. 9A and 9B are each a cross-sectional schematic diagram for explaining a function in the sub-pixel (blue) and the sub-pixel (white), respectively.

Here, in this embodiment of the present disclosure, as shown in FIG. 5 to FIG. 7, at the black matrix 16M that is arranged in the color filter layer 16, the aperture width $L_{BM}$ (W) of the aperture Mw facing the sub-pixel 10W is designed to become smaller than the aperture width $L_{BM}$ of the aperture M1 in each of the sub-pixels 10R, 10G, and 10B. In this way, as shown in FIG. 9A, in the sub-pixels 10R, 10G, and 10B (the sub-pixel 10B is illustrated by an example here), the optimal aperture width $L_{BM}$ and the aperture margin d are set up from the above-described viewpoint to ensure that the larger amount of color light is transmitted therethrough (emitted) toward the oblique direction (denoted by dashed arrows in the drawing). On the other hand, as shown in FIG. 9B, in the sub-pixel 10W, the aperture Mw has the aperture width $L_{BM}$ (W) smaller than such a aperture width $L_{BM}$, and thus it is more likely that the color light which is transmitted therethrough toward the oblique direction will be blocked by the aperture Mw on the black matrix 16M as compared with a case of the sub-pixel 10B (vignetting may occur more easily). In such a manner, by utilizing vignetting in a part of the sub-pixel 10B, that is, vignetting in the vicinity of an edge of the aperture Mw on the black matrix 16M, the transmittance in the oblique direction is reduced in the sub-pixel 10W. As a result, especially in the oblique direction in which a difference in the transmittance becomes prominent, a difference in the transmittance among each of the sub-pixels is reduced to keep an excellent luminance balance in the overall viewing angles.

Further, in this embodiment of the present disclosure, the aperture width $L_{BM}(W)$ is designed to be larger than the pixel width $L_P$ as with the aperture width $L_{BM}$, and thus the transmittance in the front direction is not reduced. As described above, because a difference in the transmittance among each of the sub-pixels appears dominantly in the oblique direction, it is possible to efficiently perform approximation of the transmittance among each of the sub-pixels by reducing a difference in the transmittance in the oblique direction instead of a difference in that in the front direction.

Figure 10:
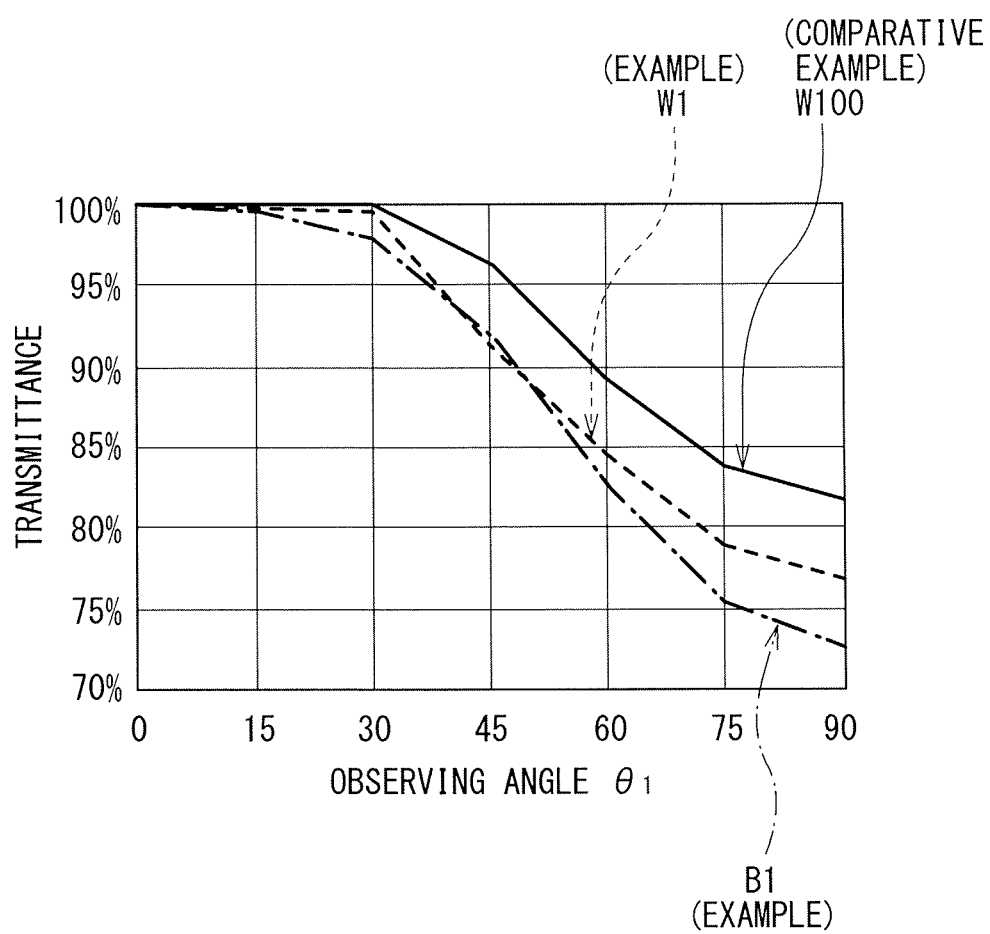
FIG. 10 is a characteristic diagram showing a change in the transmittance versus the viewing angle.

For example, FIG. 10 shows a change in the transmittance versus the viewing angle for the sub-pixel 10B where the blue filter 16B having the band transmittance of 0.8 is provided, and for the sub-pixel 10W having the transmittance of 0.99 (that is provided with a high-transmittance filter). In concrete terms, the transmittance B1 of the sub-pixel 10B (pixel width $L_P$: 50 µm, aperture width $L_{BM}$: 70 µm, and aperture margin d: 10 µm) and the transmittance W1 of the sub-pixel 10W (pixel width Lp: 50 µm, aperture width $L_{BM}(W)$: 65 µm, and aperture margin d: 7.5 µm) are shown as an example. Further, as a comparative example, the transmittance W100 of the sub-pixel 10W that is designed with the same pixel width Lp, aperture width $L_{BM}$, and aperture margin d as with the sub-pixel 10B is shown as well.

As described above, when the aperture width and the aperture margin are made equivalent in the sub-pixel 10B and the sub-pixel 10W, it is seen that a difference in the transmittance is made between the transmittance B1 of the sub-pixel 10B and the transmittance W100 of the sub-pixel 10W, and such a difference increases especially in the oblique direction in which the observing angle $\theta_1$ becomes large. On the contrary, it is seen that the transmittance W1 of the sub-pixel 10W the aperture width and the aperture margin of which are designed to be smaller than those in the sub-pixel 10B comes near the transmittance B1 of the sub-pixel 10B as compared with the transmittance W100 in the comparative example.

Figure 11:
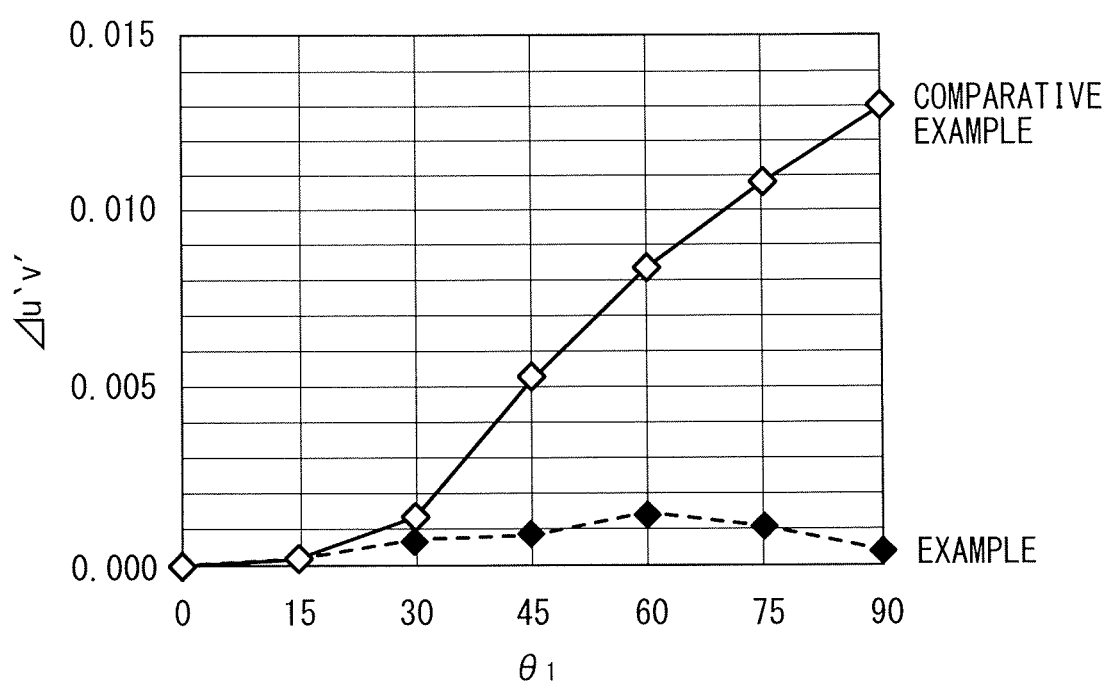
FIG. 11 is a characteristic diagram showing a change in the chromaticity versus the viewing angle.

Further, FIG. 11 shows a change in the chromaticity versus the viewing angle in a case where the sub-pixels 10B and 10W according to the above-described example are made luminescent by mixture in color under a given luminescence spectrum. Further, as a comparative example, a change in the chromaticity in a case where the sub-pixels 10B and 10W each of which is designed with the same aperture width and the aperture margin as described above are mixed in color is shown as well. In an example using the sub-pixel 10W the aperture width and the aperture margin of which are designed to be smaller than those in the sub-pixel 10B, a change in the chromaticity was hardly seen even in the event of an increase in the observing angle $\theta_1$ as compared with the comparative example where these are designed to be the same. As a result, it is seen that a change in the chromaticity which is caused by a difference in the transmittance between the sub-pixels (especially a change in the chromaticity with a change in the viewing angle) is suppressed by a control of the aperture width of the sub-pixel 10W.

As described above, in this embodiment of the present disclosure, each of the pixels P has the sub-pixels 10R, 10G, and 10B corresponding to R, G, and B respectively, as well as the sub-pixel 10W that exhibits the higher luminance than the above-described sub-pixels, and the sub-pixels 10R, 10G, and 10B are provided with the color filters (16R, 16G, and 16B). The sub-pixel 10W is configured in such a manner that the transmittance of white light emitted from the white organic EL device 10a is reduced in a partial or whole area thereof. In concrete terms, in this embodiment of the present disclosure, in the organic EL display unit 1 of the top-emission method, the aperture width $L_{BM}(W)$ of the black matrix 16M in the sub-pixel 10W is smaller than the aperture width $L_{BM}$ in each of any other sub-pixels. Consequently, at a part of the sub-pixel 10W, vignetting of the white light occurs more frequently as compared with any other sub-pixels, and the transmittance of light to be emitted especially toward the oblique direction is reduced. Therefore, this reduces a difference in the transmittance among the sub-pixels 10R, 10G, and 10B having the color filters (16R, 16G, and 16B) and the sub-pixel 10W having no color filter. Here, the above-described difference in the transmittance among the sub-pixels has a tendency toward an increase with a change in the viewing angle, although such a control of the aperture width allows the desired luminance and chromaticity to be represented especially when an observation is made from the oblique direction. This makes it possible to achieve the high image quality in carrying out the image display using the four-color sub-pixels.

Next, the description is provided on a second embodiment and modification examples of the present disclosure. Hereinafter, the description is provided on only a simplified configuration or a configuration of main parts in each mode, and any component parts essentially same as those in the above-described first embodiment are denoted with the same reference numerals, and the related descriptions are omitted as appropriate.

2. Second Embodiment

Figure 12:
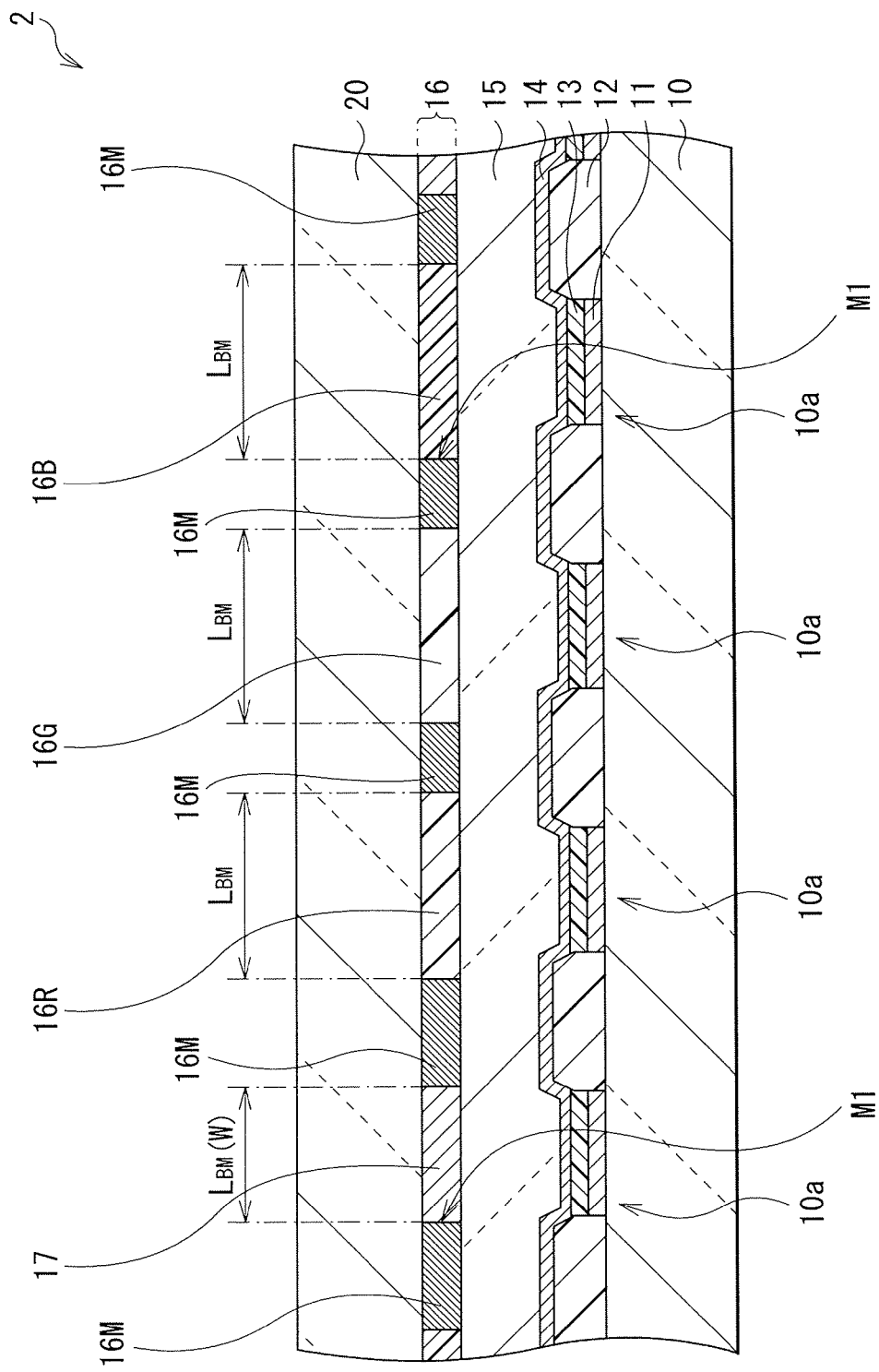
FIG. 12 is a cross-sectional view showing a simplified configuration of a display unit according to a second embodiment of the present disclosure.

FIG. 12 shows a cross-sectional configuration of a display unit (organic EL display unit 2) according to a second embodiment of the present disclosure. As with the organic EL display unit 1 according to the above-described first embodiment of the present disclosure, the organic EL display unit 2 carries out a full-color image display utilizing the so-called top-emission method. Further, the organic EL display unit 2 performs the above-described image display using four-color sub-pixels 10R, 10G, 10B, and 10W, each of which includes a white organic EL device 10a as a light-emitting device. Additionally, each of these white organic EL devices 10a is provided between a driving substrate 10 and a sealing substrate 20, and a color filter layer 16 is formed on the side of the sealing substrate 20.

Further, also in this embodiment of the present disclosure, the color filter layer 16 has a black matrix 16M having an aperture M1 in opposition to each of the sub-pixels 10R, 10G, 10B, and 10W, and color filters (16R, 16G, and 16B) are formed at the apertures M1 in the sub-pixels 10R, 10G, and 10B.

In this embodiment of the present disclosure, however, unlike the above-described first embodiment of the present disclosure, on the color filter layer 16, an aperture width $L_{BM}$ and an aperture margin d (not shown in FIG. 12) of the aperture M1 at the black matrix 16M are the same among each of the sub-pixels. Further, in the sub-pixel 10W, an ND filter 17 (neutral density filter) is formed. This ND filter 17 is a functional filter that may reduce the amount of transmitted light over a whole area of the sub-pixel 10W, for example. The transmittance of the ND filter 17 may be preferably set up to be equivalent to that in each of any other sub-pixels 10R, 10G, and 10B.

Like this embodiment of the present disclosure, also by providing the ND filter 17 having a transmittance control function in the sub-pixel 10W, it is possible to obtain the same effects as with the above-described first embodiment in which a control of the aperture width of the black matrix 16M is carried out.

Figure 13:
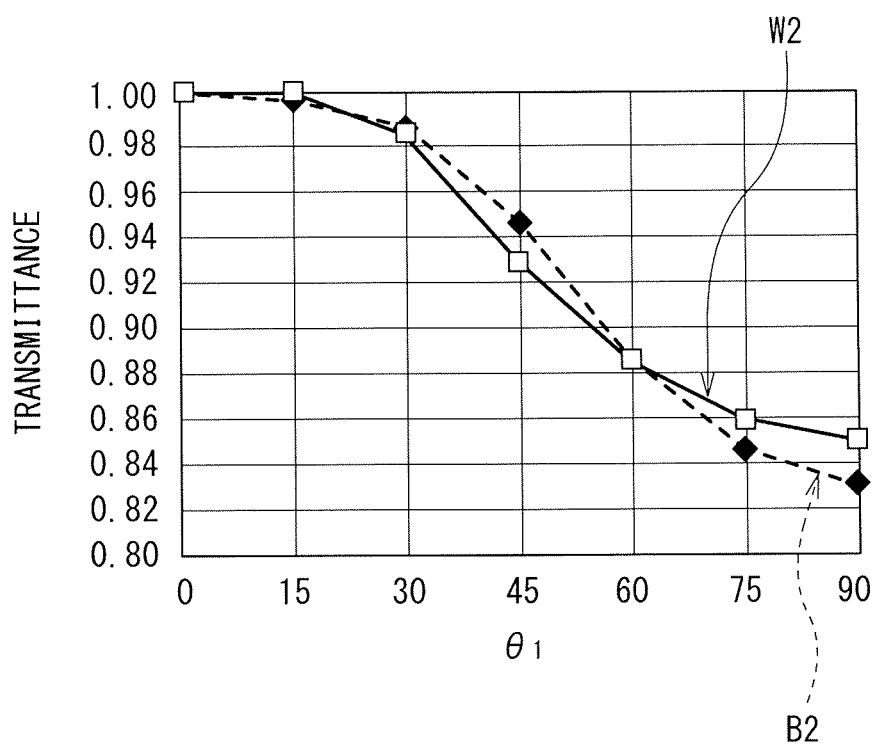
FIG. 13 is a characteristic diagram showing a change in the transmittance versus the viewing angle.

For example, FIG. 13 shows a change in the transmittance (transmittance B2) versus the viewing angle for the sub-pixel 10B that is provided with the blue filter 16B having the band transmittance of 0.8 and a change in the transmittance (transmittance W2) versus the viewing angle for the sub-pixel 10W that is provided with the ND filter 17 having the transmittance of approximately 0.8 at the entire visible wavelength band. On this occasion, in both of the sub-pixels 10B and 10W, the pixel width Lp and the aperture width $L_{BM}$ were set at 50 µm and 70 µm, respectively.

Figure 14:
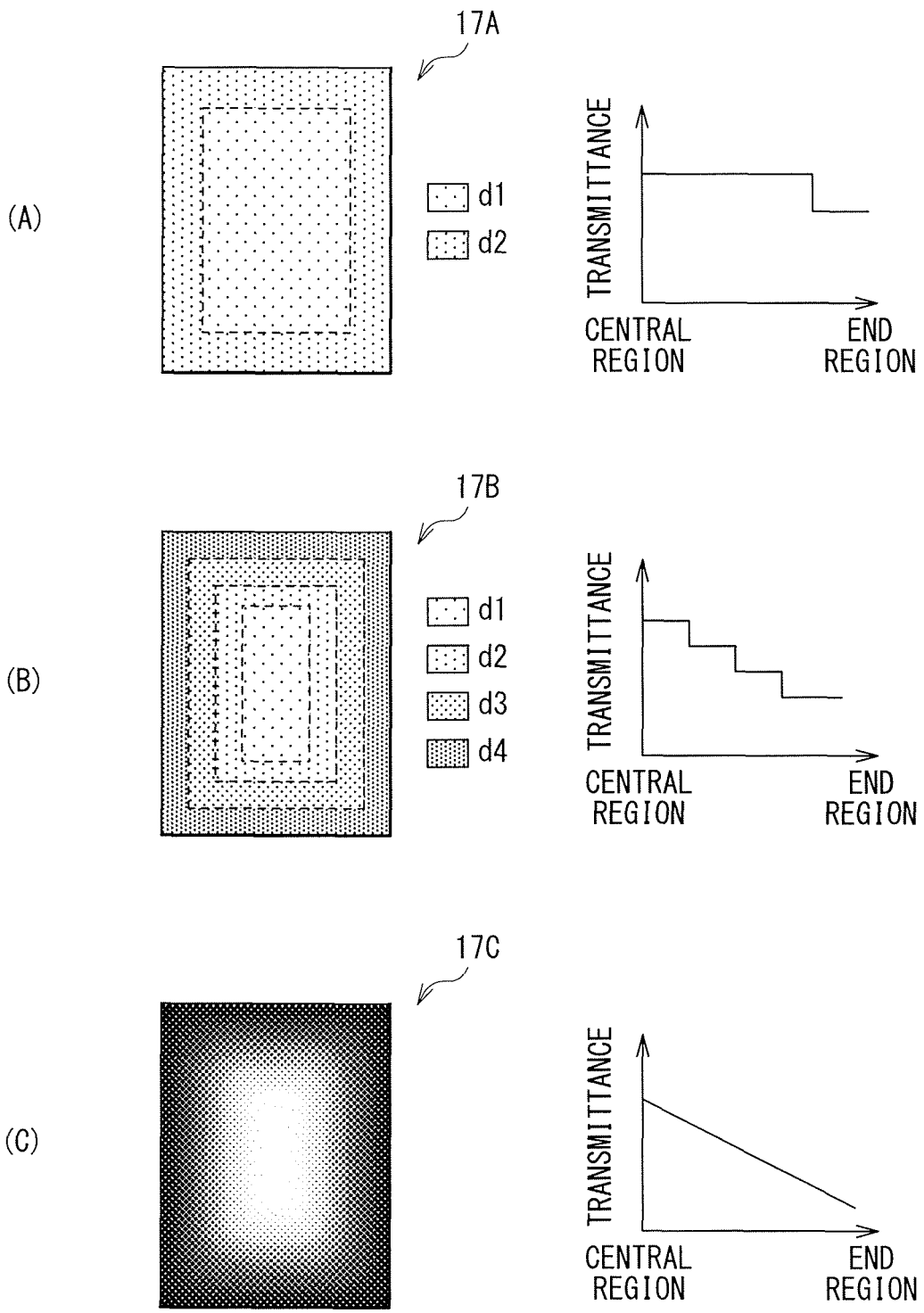
FIGS. 14A through 14C are schematic diagrams showing another example of a configuration of an ND filter.

In such a manner, when the sub-pixel 10W having the ND filter 17 was used, it was seen that the transmittances B2 and W2 of the sub-pixels 10B and 10W respectively substantially coincided with one another, and there was hardly a difference in the transmittance with a change in the viewing angle. It is to be noted that a filter for reducing the transmittance over a whole region of the sub-pixel 10W is here illustrated by an example as the ND filter 17, although the transmittance of this ND filter 17 may be uniform over a whole region of the sub-pixel 10W, or may be different in each of the regions. For example, as shown in FIG. 14A, an ND filter 17A may be permitted that is configured in such a manner that the lower transmittance is achieved at an end region d2 rather than at a central region d1. Further, as shown in FIG. 14B, an ND filter 17B may be permitted that is configured in such a manner that the transmittance is reduced in incremental steps from a central region d1 toward regions d2 and d3 as well as an end region d4. Additionally, as shown in FIG. 14C, an ND filter 17C may be permitted that is configured in such a manner that the transmittance is reduced gradually (continuously) from a central region toward an end region. It is to be noted that, in each of FIGS. 14A to 14C, the left-hand drawing is a conceptual diagram showing an X-Y planar configuration for each of the ND filters 17A to 17C, and a right-side drawing is a conceptual diagram showing a change in the transmittance at a region from a central portion as far as an end portion of an X-Y planar shape. Further, the left-hand drawing in FIG. 14C shows the transmittance distribution in accordance with graduations of a color, and indicates that the transmittance is relatively higher as a color comes closer to a white, and the transmittance is relatively lower as a color comes closer to a black. Such a configuration makes it possible to achieve more elaborate control of the transmittance, and makes it easy to obtain the desired chromaticity even in the oblique direction.

It is to be noted that the transmittance of the above-described ND filter 17 and the transmittance at each region of the ND filters 17A to 17C may be the same among each of the sub-pixels 10R, 10G, and 10B, or may be different for each of the sub-pixels 10R, 10G, and 10B (for each of transmission wavelengths). For example, when the sub-pixel itself gives rise to a change in the chromaticity in the viewing angle direction (oblique direction) (for example, the chromaticity changes roughly toward a yellow direction), the transmittance in the sub-pixel corresponding to a complementary color of the varying color (for example, a blue color in a case where the chromaticity changes toward a yellow direction) may be raised. This makes it possible to maintain the chromaticity in the viewing angle direction in a balanced manner. Alternatively, the chromaticity in the viewing angle direction may be maintained by further raising the transmittance in the sub-pixel that is set at the high transmittance among the sub-pixels 10R, 10G, and 10B.

Modification Example 1

It is to be noted that, in the above-described first and second embodiments of the present disclosure, the description is provided by taking as an example an organic EL display unit using a light-emitting technique based on the top-emission method, although the display unit according to this embodiment of the present disclosure is also applicable to an organic EL display unit of a bottom-emission type (so-called bottom-emission method). In this case, a color filter layer is formed on the driving substrate 10 instead of the sealing substrate 20. Consequently, this eliminates the necessity of providing the black matrix 16M as described above (it is unnecessary because of a short distance between a light-emitting point and a color filter), although color filters are formed in sub-pixels of R, G, and B, while sub-pixel of W is not provided with such a color filter. Therefore, as with the above-described first embodiment of the present disclosure, a difference in the transmittance is made among the sub-pixel of W and the other sub-pixels to cause a change in the chromaticity.

Accordingly, in an organic EL display unit of a bottom-emission method like this modification example, the ND filter as described in the above-described second embodiment of the present disclosure may be provided at a region corresponding to the sub-pixel of W on the driving substrate 10. Even in the bottom-emission method, this makes it possible to reduce the transmittance of display light (white light) that is extracted from the bottom of the driving substrate 10 in the sub-pixel of W and decrease a difference in the transmittance among the above-described sub-pixels. This allows to obtain the same effects as with the above-described first embodiment of the present disclosure.

It is to be noted that, in the bottom-emission method, the first electrode 11 described in the above-described first embodiment of the present disclosure is configured of a transparent conductive film, and the second electrode 14 is made of a reflective metal, or is configured of a laminated film of a transparent conductive film and a reflective metal film.

Modification Example 2

Figure 15:
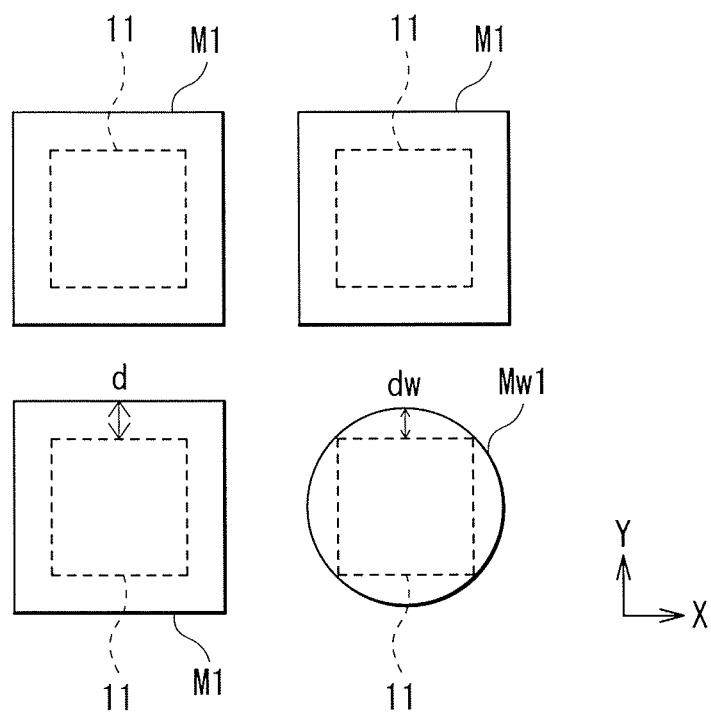
FIG. 15 is a schematic plan view for explaining a shape of an aperture according to a modification example 2.

FIG. 15 schematically shows another example of a shape of the aperture Mw of the black matrix 16M that is described in the above-described first embodiment of the present disclosure. In this modification example, an aperture Mw1 facing a sub-pixel of W may take a circular form, for example. It is to be noted that the pixel width $L_P$ is designed to be the same among each of sub-pixels and to be equivalent to the aperture margin d at the aperture M1 in each of sub-pixels of R, G, and B. On the other hand, at the aperture Mw1, the aperture margin varies due to a circular aperture shape, although it is equivalent to the aperture margin dw at the largest position.

In such a manner, the aperture in the sub-pixel of W may take a shape like a circular form (isotropic form). This makes it possible to control the transmittance isotropically. It is to be noted that an ellipse, a polygon, and the like may be permitted alternatively in addition to the circular form.

Modification Example 3

Figure 16:
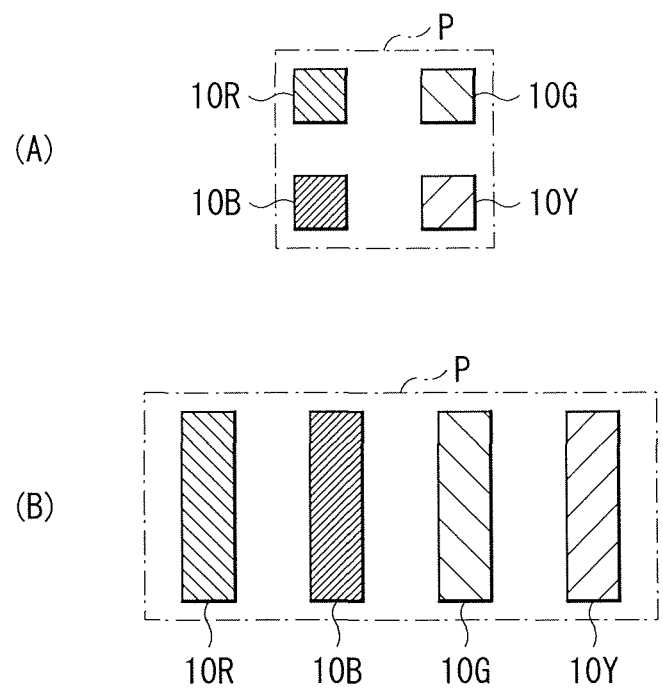
FIGS. 16A and 16B are schematic diagrams showing an example of a configuration and a layout of sub-pixels according to a modification example 3.

FIGS. 16A and 16B are each a schematic diagram for explaining a layout of sub-pixels according to a modification example 3. In the above-described embodiments and the like, a case where the sub-pixel 10W that emits white light is provided as a sub-pixel exhibiting the high luminance, and four colors of R, G, B, and W are used to carry out an image display is illustrated by an example, although the high-luminance sub-pixel is not limited to W, but a sub-pixel 10Y of Y (yellow) may be used alternatively. This sub-pixel 10Y may be configured by combining the same white organic EL device 10a as with the above-described embodiments and the like with a yellow filter, or a yellow organic EL device may be used as a light-emitting device without forming the color filter. As the yellow organic EL device, for example, a laminated layer of a green light-emitting layer and a red light-emitting layer may be used as a light-emitting layer. It is to be noted that, for a layout of each sub-pixel, the sub-pixels may be arranged in a 2×2 matrix, or may be provided in line along a row direction or a column direction as with the above-described embodiments and the like.

Module and Application Examples

Next, with reference to FIG. 17 to FIG. 22, the description is provided on application examples of the organic EL display unit 1 and the like (hereinafter, the organic EL display unit 1 is taken as an example) that are described in the above-described embodiments and the modification examples thereof of the present disclosure. The organic EL display unit 1 as described above is applicable to electronic apparatuses in every field, such as a television receiver, a digital camera, a notebook personal computer, a mobile terminal including a mobile phone, or a video camera that are described below. In other words, this organic EL display unit 1 is applicable to electronic apparatuses in every field that display externally input image signals or internally generated image signals as images or video pictures.

(Module)

Figure 17:
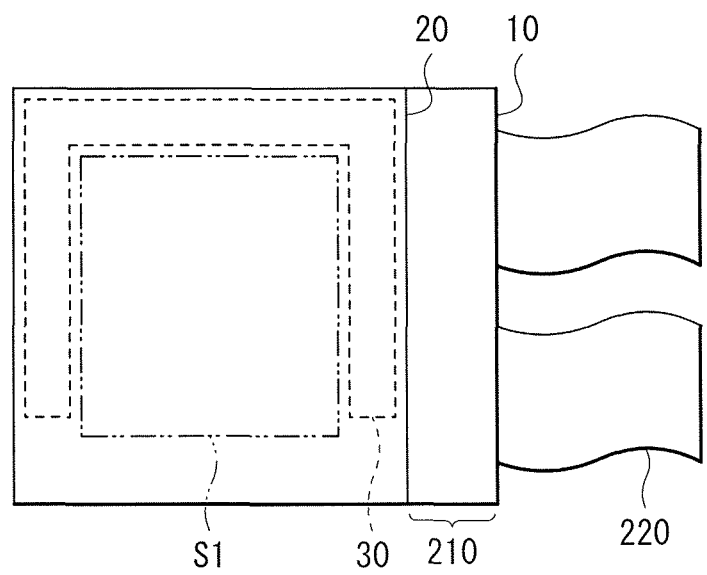
FIG. 17 is a schematic diagram showing an example of a module for which the display unit according to any of the embodiments and the modification examples of the present disclosure is used.

The display unit 1 is incorporated into various electronic apparatuses according to application examples 1 to 5 as a module as shown in FIG. 17, for example. This module may be configured, for example, in such a manner that a region 210 exposed from the sealing substrate 20 is provided on one side of the driving substrate 10, and external connection terminals (not shown in the drawing) are formed by extending wiring of the driving circuit 30 at this exposed region 210. An FPC (Flexible Printed Circuit Board) 220 for signal input/output may be provided at these external connection terminals.

Application Example 1

Figure 18:
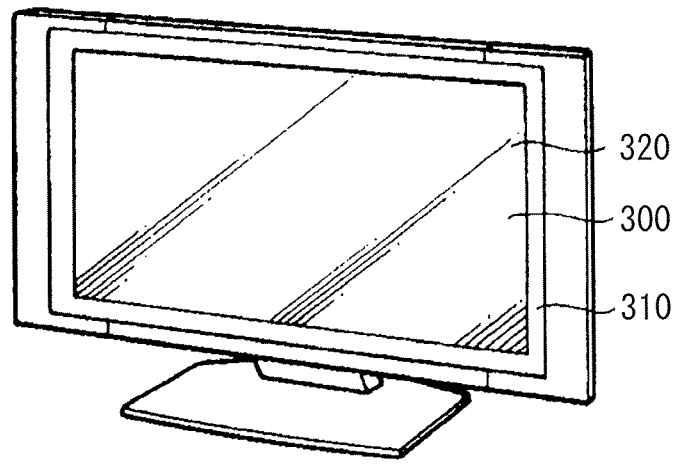
FIG. 18 is a perspective view showing an external appearance of an application example 1.

FIG. 18 shows an external appearance of a television receiver. This television receiver may have, for example, an image display screen section 300 including a front panel 310 and a filter glass 320, and this image display screen section 300 is configured of the organic EL display unit 1.

Application Example 2

Figure 19:
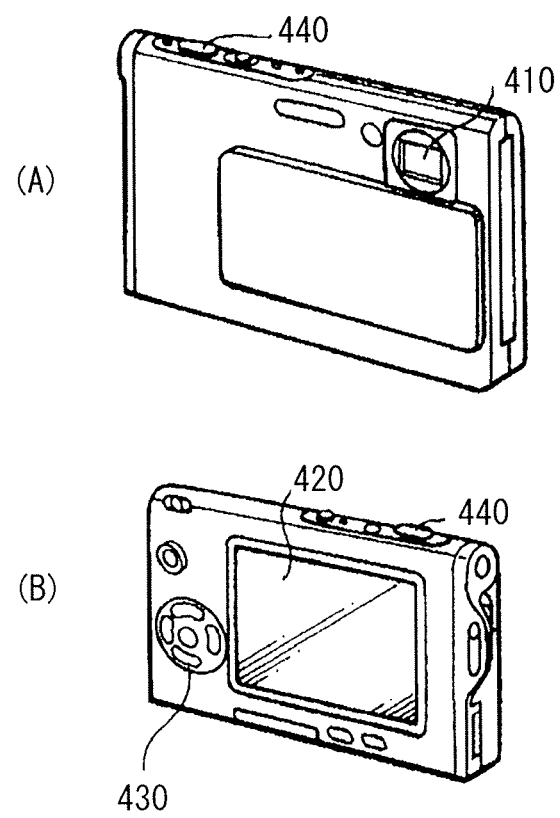
FIG. 19A is a perspective view showing an external appearance viewed from the front side of an application example 2.
FIG. 19B is a perspective view showing an external appearance viewed from the backside of the application example 2.

FIG. 19 shows an external appearance of a digital camera. This digital camera may have, for example, a light-emitting section 410 for flashing, a display section 420, a menu switch 430, and a shutter button 440, and this display section 420 is configured of the organic EL display unit 1.

Application Example 3

Figure 20:
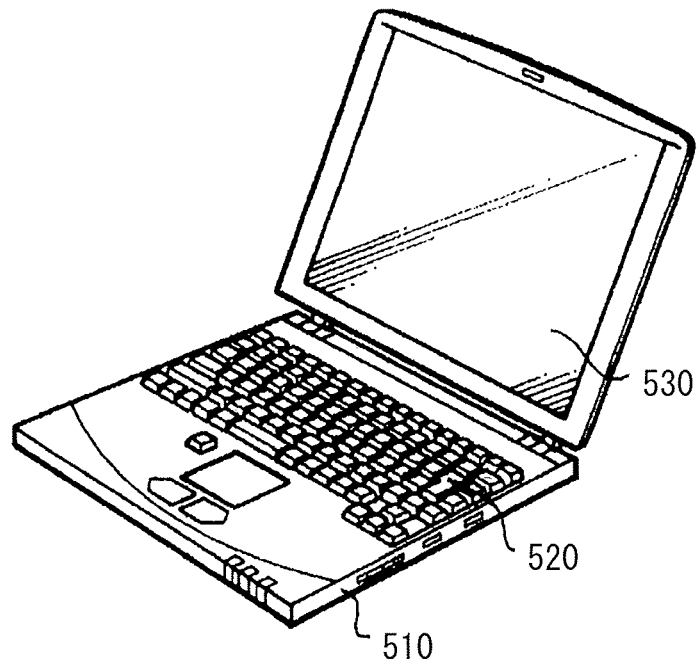
FIG. 20 is a perspective view showing an external appearance of an application example 3.

FIG. 20 shows an external appearance of a notebook personal computer. This notebook personal computer may have, for example, a main unit 510, a keyboard 520 for operation of entering characters and the like, and a display section 530 for displaying images, and this display section 530 is configured of the organic EL display unit 1.

Application Example 4

Figure 21:
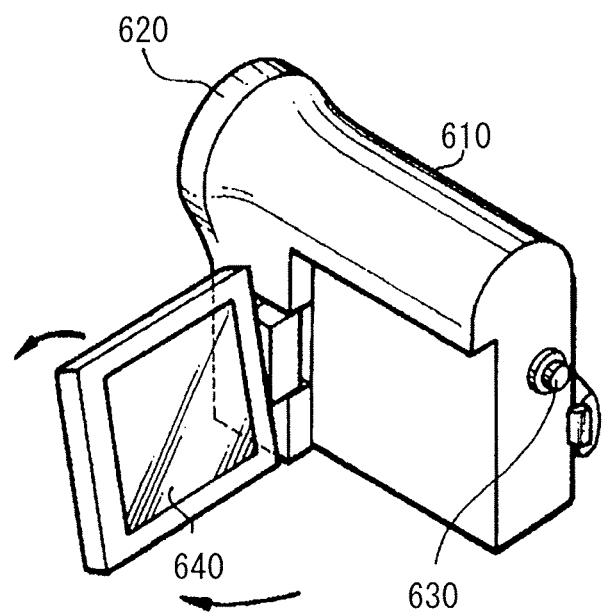
FIG. 21 is a perspective view showing an external appearance of an application example 4.

FIG. 21 shows an external appearance of a video camera. This video camera may have, for example, a main unit section 610, a lens 620 for photographing a subject that is provided at the front lateral surface of this main unit section 610, a start/stop switch 630 at the photographing time, and a display section 640. This display section 640 is configured of the organic EL display unit 1.

Application Example 5

Figure 22:
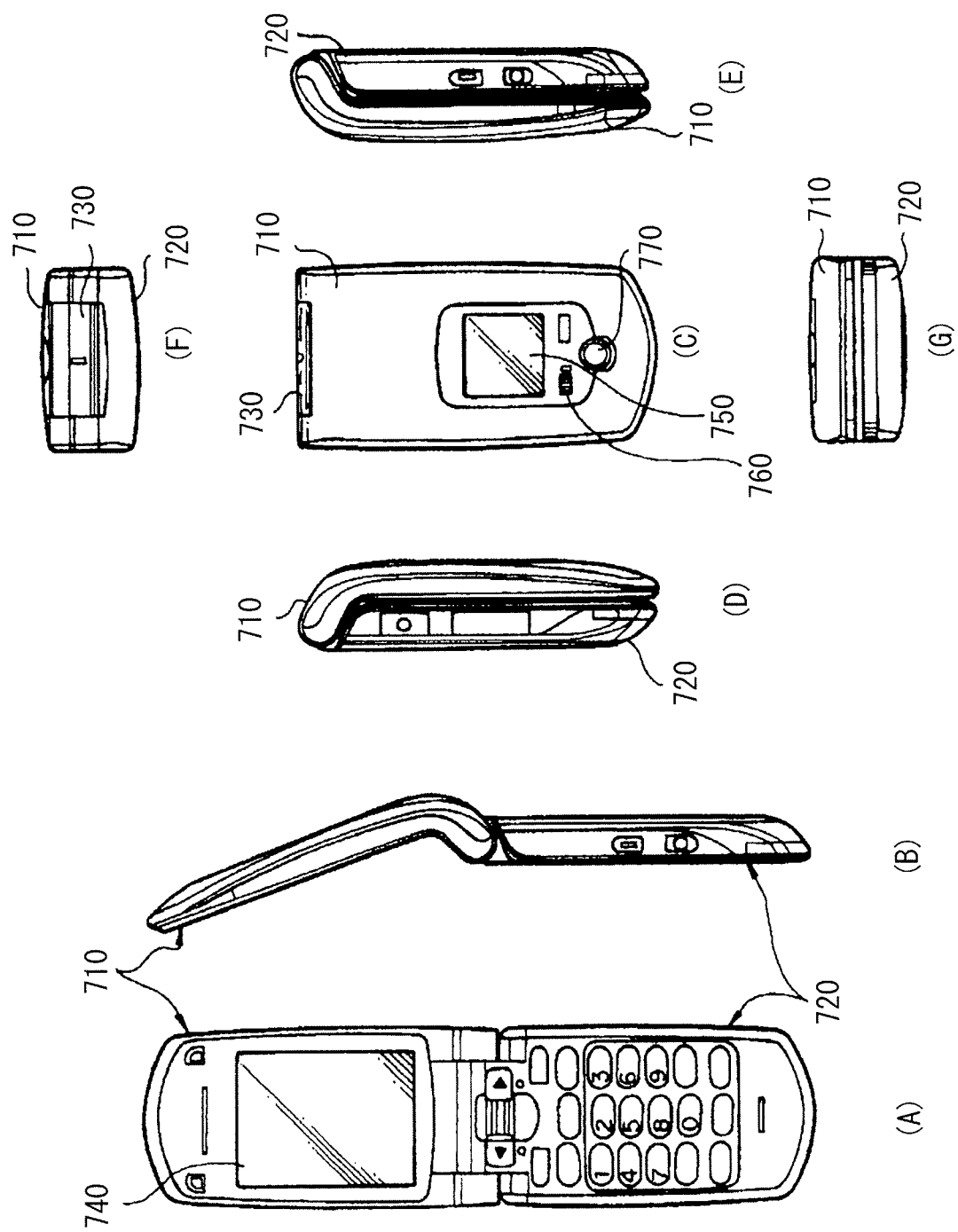
FIG. 22A is a front view of an application example 5 in an open state.
FIG. 22B is a side view thereof.
FIG. 22C is a front view in a closed state.
FIG. 22D is a left side view.
FIG. 22E is a right side view.
FIG. 22F is a top view.
FIG. 22G is a bottom view.

FIG. 22 shows an external appearance of a mobile phone. For example, this mobile phone may join an upper chassis 710 and a lower chassis 720 by means of a connecting section (hinge section) 730, and may have a display 740, a sub-display 750, a picture light 760, and a camera 770. The display 740 or the sub-display 750 of these component parts is configured of the organic EL display unit 1.

The present disclosure is described thus far with reference to some embodiments and modification examples as well as the application examples, although the present disclosure is not limited to the above-described embodiments and the like, but different variations are available. For example, in the above-described first embodiment of the present disclosure, a configuration that changes only the aperture width of the black matrix 16M in the sub-pixel 10W is illustrated by an example, although a configuration is not limited to such a configuration, and it is possible to obtain the effects equivalent to those in the present disclosure provided that the aperture width of the sub-pixel 10W is relatively smaller as compared with the other sub-pixels. For example, the aperture widths in the sub-pixels other than the sub-pixel 10W may be changed, or a pixel aperture width (a width of the first electrode 11) in the sub-pixel 10W is changed to control the transmittance, or any of these change control methods may be combined.

Further, in the above-described embodiments and the like, the description is provided on a case where each of the sub-pixels has the white organic EL device 10a having a white light-emitting layer, although a configuration is not limited thereto, and devices that emit each color light of R, G, and B separately may be used as light-emitting devices in the sub-pixels 10R, 10G, and 10B. Also for the white light-emitting layer, a structure in which a plurality of light-emitting layers are arranged in an in-plane direction may be permitted instead of a structure in which a plurality of light-emitting layers with different luminescent colors are laminated. Furthermore, in the above-described embodiments and the like, the description is provided by taking a self-emitting type organic EL device as an example of the light-emitting device, although the light-emitting device is not limited to such a self-emitting type light-emitting device, and a light-emitting device (display device) such as a liquid crystal display device may be used alternatively.

Additionally, in the above-described embodiments and the like, the description is provided by taking as an example a case where the first electrode 11 functions as an anode, and the second electrode 14 functions as a cathode, although conversely the first electrode 11 may function as the cathode, and the second electrode 14 may function as the anode.

Moreover, in the above-described embodiments and the like, the description is provided on a case where the organic EL display unit 1 is an active-matrix type, although a configuration of a pixel circuit for active-matrix driving is not limited to any of the configurations described in the above-described embodiments and the like. For example, in the pixel circuit, a capacitor device, a transistor, and the like may be added or replaced as necessary. Further, in this case, in addition to the scan line driving circuit 33, the signal line driving circuit 34, and the power line driving circuit 35 that are described previously, any necessary driving circuit may be added in response to a modification of the pixel circuit.

Further, in the above-described embodiments and the like, the description is provided on a case where the timing generating circuit 32 controls the driving operation in the scan line driving circuit 33, the signal line driving circuit 34, and the power line driving circuit 35, although another circuit may control such a driving operation. Alternatively, such a control of the scan line driving circuit 33, the signal line driving circuit 34, and the power line driving circuit 35 may be carried out in hardware (circuits) or in software (programs).

Also, the display unit and the electronic apparatus of the present disclosure may have a configuration described in following (1) to (20).

(1) A display unit, including: a plurality of pixels having first to third sub-pixels each of which corresponds to respective colors of red (R), green (G), and blue (B), and a fourth sub-pixel exhibiting higher luminance than the first to third sub-pixels, wherein in each of the plurality of pixels, the first to fourth sub-pixels have light-emitting devices between a pair of substrates that are arranged in opposition to each other, and the first to third sub-pixels are provided with color filters that selectively transmit corresponding color light therethrough on the side of one substrate of a pair of the substrates, and in the fourth sub-pixel, the transmittance of light emitted from the light-emitting device is configured to be reduced at a partial or whole region of the fourth sub-pixel.

(2) The display unit according to (1), wherein a pair of the substrates are a driving substrate having a pixel driving circuit and a sealing substrate that is configured of a transparent substrate, and the color filters are provided on the side of the sealing substrate.

(3) The display unit according to (1) or (2), further including a black matrix having apertures in opposition to the first to fourth sub-pixels, wherein the color filter is provided at each of apertures facing the first to third sub-pixels on the black matrix, and in the fourth sub-pixel, an aperture width of the black matrix is smaller than each of aperture widths in the first to third sub-pixels.

(4) The display unit according to any one of (1) to (3), wherein in the black matrix, each of apertures facing the first to third sub-pixels takes a rectangular shape, and an aperture facing the fourth sub-pixel takes a circular shape, an elliptic shape, or an n-polygonal shape (n is an integer of 5 or more).

(5) The display unit according to any one of (1) to (4), wherein each of the first to fourth sub-pixels has a pixel electrode in the shape identical to each other on the driving substrate, and a shape of each aperture of the black matrix is larger in size than a planar shape parallel to a substrate surface of the pixel electrode.

(6) The display unit according to any one of (1) to (5), wherein in each of the first to third sub-pixels, each aperture width is set up for each of transmission wavelengths thereof.

(7) The display unit according to any one of (1) to (6), wherein each aperture width in the first to third sub-pixels is set up in consideration of a density of the color filter.

(8) The display unit according to any one of (1) to (7), wherein the plurality of pixels are arrayed two-dimensionally along two orthogonal directions, and in one selective direction of these two directions, an aperture width in the fourth sub-pixel is smaller than each of aperture widths in the first to third sub-pixels.

(9) The display unit according to any one of (1) to (8), further comprising a black matrix having apertures in opposition to the first to fourth sub-pixels, wherein the color filter is provided at each of apertures facing the first to third sub-pixels on the black matrix, and a neutral density filter is provided at an aperture facing the fourth sub-pixel of the black matrix.

(10) The display unit according to any one of (1) to (9), wherein the transmittance of the neutral density filter is set up to be equivalent to the transmittance at a transmission band in each of the color filters of the first to third sub-pixels.

(11) The display unit according to any one of (1) to (10), wherein the transmittance of the neutral density filter is configured to be lower at an end region than at a central region.

(12) The display unit according to any one of (1) to (11), wherein the transmittance of the neutral density filter is configured to be reduced in incremental steps from a central region toward an end region.

(13) The display unit according to any one of (1) to (12), wherein the transmittance of the neutral density filter is configured to be reduced continuously from a central region toward an end region.

(14) The display unit according to any one of (1) to (13), wherein in each of the first to third sub-pixels, the transmittance is set up for each of transmission wavelengths thereof.

(15) The display unit according to any one of (1) to (14), wherein a pair of the substrates are a driving substrate having a pixel driving circuit on a transparent substrate and a sealing substrate, and the color filters are provided on the side of the driving substrate.

(16) The display unit according to any one of (1) to (15), wherein on the driving substrate, the color filters are provided at a region corresponding to the first to third sub-pixels, and a neutral density filter is provided at a region corresponding to the fourth sub-pixel.

(17) The display unit according to any one of (1) to (16), wherein the fourth sub-pixel corresponds to a white color (W) or a yellow color (Y).

(18) The display unit according to any one of (1) to (17), wherein the light-emitting device is an organic electroluminescence device.

(19) The display unit according to any one of (1) to (18), wherein the electroluminescence device emits white light.

(20) An electronic apparatus provided with a display unit, the display unit including: a plurality of pixels having first to third sub-pixels each of which corresponds to respective colors of red (R), green (G), and blue (B), and a fourth sub-pixel exhibiting higher luminance than the first to third sub-pixels, wherein in each of the plurality of pixels, the first to fourth sub-pixels have light-emitting devices between a pair of substrates that are arranged in opposition to each other, and the first to third sub-pixels are provided with color filters that selectively transmit corresponding color light therethrough on the side of one substrate of a pair of the substrates, and in the fourth sub-pixel, the transmittance of light emitted from the light-emitting device is configured to be reduced at a partial or whole region of the fourth sub-pixel.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A display unit, comprising:
   a plurality of pixels having first to third sub-pixels each of which corresponds to respective colors of red (R), green (G), and blue (B), and a fourth sub-pixel exhibiting higher luminance than the first to third sub-pixels,
   wherein in each of the plurality of pixels,
   the first to fourth sub-pixels have light-emitting devices between a pair of substrates that are arranged in opposition to each other, and
   the first to third sub-pixels are provided with color filters that selectively transmit corresponding color light therethrough on the side of one substrate of a pair of the substrates, and
   in the fourth sub-pixel, the transmittance of light emitted from the light-emitting device is configured to be reduced at a partial or whole region of the fourth sub-pixel;
   wherein a pair of the substrates are a driving substrate having a pixel driving circuit and a sealing substrate that is configured of a transparent substrate, and
   the color filters are provided on the side of the sealing substrate;
   further comprising a black matrix having apertures in opposition to the first to fourth sub-pixels, wherein
   the color filter is provided at each of apertures facing the first to third sub-pixels on the black matrix, and
   a neutral density filter is provided at an aperture facing the fourth sub-pixel on the black matrix:
   wherein the transmittance of the neutral density filter is configured to be lower at an end region than at a central region.

2. The display unit according to claim 1, further comprising a black matrix having apertures in opposition to the first to fourth sub-pixels, wherein
   the color filter is provided at each of apertures facing the first to third sub-pixels on the black matrix, and
   in the fourth sub-pixel, an aperture width of the black matrix is smaller than each of aperture widths in the first to third sub-pixels.

3. The display unit according to claim 1, wherein in the black matrix,
   each of apertures facing the first to third sub-pixels takes a rectangular shape, and
   an aperture facing the fourth sub-pixel takes a circular shape, an elliptic shape, or an n-polygonal shape (n is an integer of 5 or more).

4. The display unit according to claim 1, wherein each of the first to fourth sub-pixels has a pixel electrode in the shape identical to each other on the driving substrate, and
   a shape of each aperture of the black matrix is larger in size than a planar shape parallel to a substrate surface of the pixel electrode.

5. The display unit according to claim 1, wherein in each of the first to third sub-pixels, each aperture width is set up for each of transmission wavelengths thereof.

6. The display unit according to claim 5, wherein each aperture width in the first to third sub-pixels is set up in consideration of a density of the color filter.

7. The display unit according to claim 1, wherein the plurality of pixels are arrayed two-dimensionally along two orthogonal directions, and in one selective direction of these two directions, an aperture width in the fourth sub-pixel is smaller than each of aperture widths in the first to third sub-pixels.

8. The display unit according to claim 1, wherein the transmittance of the neutral density filter is set up to be equivalent to the transmittance at a transmission band in each of the color filters of the first to third sub-pixels.

9. A display unit, comprising:
   a plurality of pixels having first to third sub-pixels each of which corresponds to respective colors of red (R), green (G), and blue (B), and a fourth sub-pixel exhibiting higher luminance than the first to third sub-pixels,
   wherein in each of the plurality of pixels,
   the first to fourth sub-pixels have light-emitting devices between a pair of substrates that are arranged in opposition to each other, and
   the first to third sub-pixels are provided with color filters that selectively transmit corresponding color light therethrough on the side of one substrate of a pair of the substrates, and
   in the fourth sub-pixel, the transmittance of light emitted from the light-emitting device is configured to be reduced at a partial or whole region of the fourth sub-pixel;
   wherein a pair of the substrates are a driving substrate having a pixel driving circuit and a sealing substrate that is configured of a transparent substrate, and
   the color filters are provided on the side of the sealing substrate
   further comprising a black matrix having apertures in opposition to the first to fourth sub-pixels, wherein
   the color filter is provided at each of apertures facing the first to third sub-pixels on the black matrix, and
   a neutral density filter is provided at an aperture facing the fourth sub-pixel on the black matrix; and
   wherein the transmittance of the neutral density filter is configured to be reduced in incremental steps from a central region toward an end region.

10. A display unit, comprising:
    a plurality of pixels having first to third sub-pixels each of which corresponds to respective colors of red (R), green (G), and blue (B), and a fourth sub-pixel exhibiting higher luminance than the first to third sub-pixels,
    wherein in each of the plurality of pixels,
    the first to fourth sub-pixels have light-emitting devices between a pair of substrates that are arranged in opposition to each other, and
    the first to third sub-pixels are provided with color filters that selectively transmit corresponding color light therethrough on the side of one substrate of a pair of the substrates, and
    in the fourth sub-pixel, the transmittance of light emitted from the light-emitting device is configured to be reduced at a partial or whole region of the fourth sub-pixel;
    wherein a pair of the substrates are a driving substrate having a pixel driving circuit and a sealing substrate that is configured of a transparent substrate, and
    the color filters are provided on the side of the sealing substrate
    further comprising a black matrix having apertures in opposition to the first to fourth sub-pixels, wherein
    the color filter is provided at each of apertures facing the first to third sub-pixels on the black matrix, and
    a neutral density filter is provided at an aperture facing the fourth sub-pixel on the black matrix; and wherein the transmittance of the neutral density filter is configured to be reduced continuously from a central region toward an end region.

11. The display unit according to claim 1, wherein in each of the first to third sub-pixels, the transmittance is set up for each of transmission wavelengths thereof.

12. The display unit according to claim 1, wherein a pair of the substrates are a driving substrate having a pixel driving circuit on a transparent substrate and a sealing substrate, and the color filters are provided on the side of the driving substrate.

13. The display unit according to claim 12, wherein on the driving substrate, the color filters are provided at a region corresponding to the first to third sub-pixels, and a neutral density filter is provided at a region corresponding to the fourth sub-pixel.

14. The display unit according to claim 1, wherein the fourth sub-pixel corresponds to a white color (W) or a yellow color (Y).

15. The display unit according to claim 1, wherein the light-emitting device is an organic electroluminescence device.

16. The display unit according to claim 15, wherein the electroluminescence device emits white light.

17. An electronic apparatus comprising the display unit according to claim 1.

18. An electronic apparatus comprising the display unit according to claim 9.

19. An electronic apparatus comprising the display unit according to claim 10.

* * * * *